(12) United States Patent
Yang et al.

(10) Patent No.: US 11,955,423 B2
(45) Date of Patent: Apr. 9, 2024

(54) SEMICONDUCTOR DEVICE AND METHOD

(71) Applicant: Taiwan Semiconductor Manufacturing Co., Ltd., Hsinchu (TW)

(72) Inventors: Ting-Li Yang, Tainan (TW); Po-Hao Tsai, Zhongli (TW); Ming-Da Cheng, Taoyuan (TW); Yung-Han Chuang, Tainan (TW); Hsueh-Sheng Wang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 6 days.

(21) Appl. No.: 17/213,650

(22) Filed: Mar. 26, 2021

(65) Prior Publication Data
US 2022/0102269 A1 Mar. 31, 2022

Related U.S. Application Data

(60) Provisional application No. 63/084,606, filed on Sep. 29, 2020.

(51) Int. Cl.
*H01L 21/768* (2006.01)
*H01L 21/48* (2006.01)
(Continued)

(52) U.S. Cl.
CPC ........ *H01L 23/5226* (2013.01); *H01L 21/486* (2013.01); *H01L 23/528* (2013.01); *H01L 24/11* (2013.01); *H01L 24/14* (2013.01)

(58) Field of Classification Search
CPC ......... H01L 24/11; H01L 24/14; H01L 24/05; H01L 24/06; H01L 24/03; H01L 23/3157;
(Continued)

(56) References Cited

U.S. PATENT DOCUMENTS 9,263,405 B2 * 2/2016 Miao .................. H01L 24/11
11,476,220 B2 * 10/2022 Choi .................. H01L 23/562
(Continued)

OTHER PUBLICATIONS

Foreign application KR 10-2020-0081030 filed 2020-07-01, priority documents for U.S. Appl. No. 11/476,220 B2, (Year: 2020).*
(Continued)

*Primary Examiner* — Marcos D. Pizarro
*Assistant Examiner* — Tenley H Schofield
(74) *Attorney, Agent, or Firm* — Slater Matsil, LLP

(57) ABSTRACT

Methods for forming dummy under-bump metallurgy structures and semiconductor devices formed by the same are disclosed. In an embodiment, a semiconductor device includes a first redistribution line and a second redistribution line over a semiconductor substrate; a first passivation layer over the first redistribution line and the second redistribution line; a second passivation layer over the first passivation layer; a first under-bump metallurgy (UBM) structure over the first redistribution line, the first UBM structure extending through the first passivation layer and the second passivation layer and being electrically coupled to the first redistribution line; and a second UBM structure over the second redistribution line, the second UBM structure extending through the second passivation layer, the second UBM structure being electrically isolated from the second redistribution line by the first passivation layer.

20 Claims, 18 Drawing Sheets

(51) Int. Cl.
  *H01L 23/00*     (2006.01)
  *H01L 23/31*     (2006.01)
  *H01L 23/367*    (2006.01)
  *H01L 23/495*    (2006.01)
  *H01L 23/522*    (2006.01)
  *H01L 23/528*    (2006.01)
  *H01L 23/532*    (2006.01)
  *H01L 25/065*    (2023.01)

(58) Field of Classification Search
  CPC ....... H01L 23/3114; H01L 2224/17517; H01L 2224/05186; H01L 24/13; H01L 2224/036; H01L 2224/0391; H01L 2224/05018; H01L 2224/05552; H01L 2224/05557; H01L 2224/05558; H01L 2224/05567; H01L 2224/05582; H01L 2224/1146; H01L 2924/00014; H01L 2924/00012; H01L 2224/05144; H01L 2224/05181; H01L 2224/05166; H01L 2924/01074; H01L 2924/04941; H01L 2224/13147; H01L 2224/14515–14519
  See application file for complete search history.

(56) References Cited

U.S. PATENT DOCUMENTS

| | | | |
|---|---|---|---|
| 2012/0043632 A1* | 2/2012 | Nikolic | ................. H01L 31/115 257/E31.086 |
| 2014/0061897 A1 | 3/2014 | Lin et al. | |
| 2015/0130052 A1* | 5/2015 | Detalle | ................. H01L 24/11 257/737 |
| 2022/0059485 A1* | 2/2022 | Lin | ......................... H01L 24/06 |

OTHER PUBLICATIONS

English translation of foreign application KR 10-2020-0081030 filed Jul. 1, 2020, priority documents for U.S. Appl. No. 11/476,220 B2, (Year: 2020).*

* cited by examiner

SEMICONDUCTOR DEVICE AND METHOD

PRIORITY CLAIM AND CROSS-REFERENCE

This application claims the benefit of U.S. Provisional Application No. 63/084,606, filed on Sep. 29, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
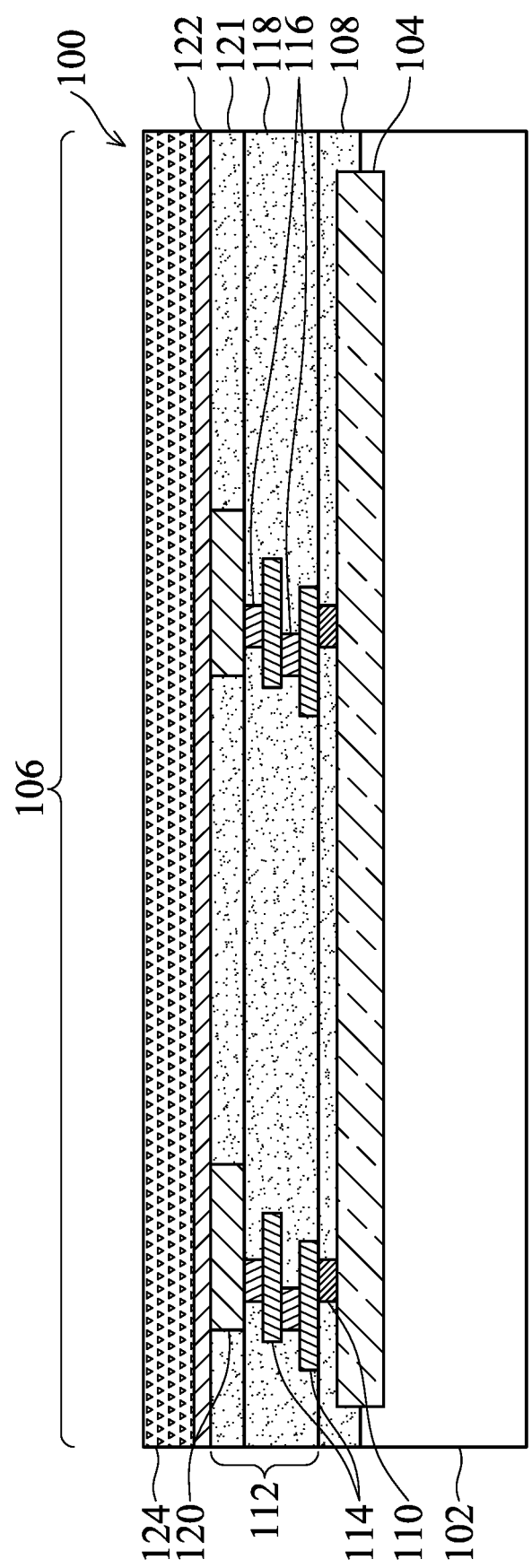
FIGS. 1 through 18 are cross-sectional views of intermediate stages in the manufacturing of semiconductor devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming improved dummy bumps over redistribution layers (RDLs) and conductive traces, and semiconductor devices formed by the same. The method includes forming a passivation structure over the RDLs and/or the conductive traces and forming a polymer structure over the passivation structure. The passivation structure may include one or more dielectric layers, such as an oxide layer and a nitride layer over the oxide layer. Openings for active bumps are formed extending through the polymer structure and the passivation structure and openings for dummy bumps are formed extending through the polymer structure and partially through the passivation structure. In some embodiments, the polymer structure may be omitted and the openings for the dummy bumps may only be formed extending partially through the passivation structure. In embodiments in which the passivation structure includes two layers, the openings for the dummy bumps extend through the top layer of the passivation structure, while being separated from the RDLs and/or the conductive traces by the bottom layer of the passivation structure. The active bumps and the dummy bumps are then formed in the respective openings, with the active bumps being in physical contact with and electrically coupled to respective RDLs and the dummy bumps being physically separated from and electrically isolated from respective RDLs and/or conductive traces by at least a portion of the passivation structure. The dummy bumps include via portions extending through portions of the polymer structure and/or the passivation structure, which improves the shear strength of the dummy bumps. This reduces device defects and improves device performance. Moreover, the dummy bumps are electrically isolated from underlying RDLs and/or conductive traces by portions of the passivation structure, which allows for active routing to extend under the dummy bumps and increases the area available for routing. This aids in the layout of devices and decreases device size. Moreover, a greater number of dummy bumps may be included, which may be used to improve bonding between semiconductor devices.

FIGS. 1 through 18 illustrate the cross-sectional views of intermediate stages in the formation of a device in accordance with some embodiments of the present disclosure. It is appreciated that although a device wafer and a device die are used as examples, the embodiments of the present disclosure may also be applied to form conductive features in other devices (e.g., package components) including, and not limited to, package substrates, interposers, packages, and the like.

FIG. 1 illustrates a cross-sectional view of a semiconductor device 100. In some embodiments, the semiconductor device 100 is a device wafer including active devices and/or passive devices, which are represented as integrated circuit devices 104. The semiconductor device 100 may be singulated to form a plurality of chips/dies 106 therefrom. In FIG. 1, a single die 106 is illustrated. In some embodiments, the semiconductor device 100 is an interposer wafer, which is free from active devices and may include passive devices. In some embodiments, the semiconductor device 100 is a package substrate strip, which includes a core-less package substrate or a cored package substrate with a core therein. In subsequent discussion, a device wafer is used as an example of the semiconductor device 100, and the semiconductor device 100 may be referred to as a wafer. The embodiments of the present disclosure may also be applied to interposer wafers, package substrates, packages, or the like.

In some embodiments, the dies 106 are logic dies (e.g., central processing units (CPUs), graphics processing units (GPUs), system-on-chips (SoCs), application processors (APs), microcontrollers, application-specific integrated circuit (ASIC) dies, or the like), memory dies (e.g., dynamic random access memory (DRAM) dies, static random access memory (SRAM) dies, high bandwidth memory (HBM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies or the like), front-end dies (e.g., analog front-end (AFE) dies), the like, or a combination thereof.

In some embodiments, the semiconductor device 100 includes a semiconductor substrate 102 and features formed at a top surface of the semiconductor substrate 102. The semiconductor substrate 102 may be a bulk semiconductor, a semiconductor-on-insulator (SOI) substrate, or the like, which may be doped (e.g., with a p-type or an n-type dopant) or undoped. The semiconductor substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as a multi-layered or gradient substrate may also be used. In some embodiments, the semiconductor material of the semiconductor substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Shallow trench isolation (STI) regions (not separately illustrated) may be formed in the semiconductor substrate 102 to isolate active regions in the semiconductor substrate 102. Vias (not separately illustrated) may be formed extending into the semiconductor substrate 102 or through the semiconductor substrate 102 (e.g., through-vias) and may be used to electrically inter-couple features on opposite sides of the semiconductor device 100.

In some embodiments, the semiconductor device 100 includes integrated circuit devices 104, which are formed on the top surface of semiconductor substrate 102. The integrated circuit devices 104 may include complementary metal-oxide semiconductor (CMOS) transistors, resistors, capacitors, diodes, and the like. The details of the integrated circuit devices 104 are not illustrated herein. In some embodiments, the semiconductor device 100 is used for forming interposers (which are free from active devices), and the semiconductor substrate 102 may be a semiconductor substrate or a dielectric substrate.

An inter-layer dielectric (ILD) 108 is formed over the semiconductor substrate 102 and fills spaces between gate stacks of transistors (not separately illustrated) in the integrated circuit devices 104. In some embodiments, the ILD 108 is formed of phosphosilicate glass (PSG), borosilicate glass (BSG), boron-doped phosphosilicate glass (BPSG), fluorine-doped silicate glass (FSG), silicon oxide, combinations or multiple layers thereof, or the like. The ILD 108 may be formed using spin coating, flowable chemical vapor deposition (FCVD), or the like. In some embodiments, the ILD 108 is formed using a deposition method such as plasma-enhanced chemical vapor deposition (PECVD), low-pressure chemical vapor deposition (LPCVD), or the like.

Contact plugs 110 are formed in the ILD 108 and electrically couple the integrated circuit devices 104 to overlying metal lines and/or vias. In some embodiments, the contact plugs 110 are formed of conductive materials, such as tungsten (W), aluminum (Al), copper (Cu), titanium (Ti), tantalum (Ta), titanium nitride (TiN), tantalum nitride (TaN), alloys or multiple layers thereof, or the like. The formation of the contact plugs 110 may include forming contact openings in the ILD 108, filling the conductive materials into the contact openings, and performing a planarization process (such as a chemical mechanical polish (CMP) process, a mechanical grinding process, an etch-back process, or the like) to level top surfaces of the contact plugs 110 with top surfaces of the ILD 108.

An interconnect structure 112 is formed over the ILD 108 and the contact plugs 110. The interconnect structure 112 includes metal lines 114 and metal vias 116, which are formed in dielectric layers 118 (also referred to as inter-metal dielectrics (IMDs)). The metal lines 114 that are formed at a same level are collectively referred to as a metal layer. In some embodiments, the interconnect structure 112 includes a plurality of metal layers including the metal lines 114 that are interconnected through the metal vias 116. The metal lines 114 and the metal vias 116 may be formed of copper, copper alloys, other metals, or the like.

In some embodiments, the dielectric layers 118 are formed of low-k dielectric materials. The dielectric constants (k-values) of the low-k dielectric materials may be lower than about 3.0. The dielectric layers 118 may comprise carbon-containing low-k dielectric materials, hydrogen silsesquioxane (HSQ), methylsilsesquioxane (MSQ), combinations or multiple layers thereof, or the like. In some embodiments, the dielectric layers 118 may include phosphosilicate glass (PSG), boro-silicate glass (BSG), boron-doped phospho-silicate glass (BPSG), undoped silicate glass (USG), or the like. In some embodiments, the dielectric layers 118 may comprise oxides (e.g., silicon oxide or the like), nitrides (e.g., silicon nitride or the like), combinations thereof, or the like. The dielectric layers 118 may be formed by FCVD, PECVD, LPCVD, or the like. In some embodiments, the formation of the dielectric layers 118 includes depositing a porogen-containing dielectric material in the dielectric layers 118 and then performing a curing process to drive out the porogen. As such, the dielectric layers 118 may be porous.

The formation of the metal lines 114 and the metal vias 116 in the dielectric layers 118 may include single damascene processes and/or dual damascene processes. In a single damascene process, a trench or a via opening is formed in one of the dielectric layers 118 and the trench or the via opening is filled with a conductive material. A planarization process, such as a CMP process, is then performed to remove excess portions of the conductive material, which may be higher than top surfaces of the dielectric layer 118, leaving a metal line 114 or a metal via 116 in the corresponding trench or via opening. In a dual damascene process, a trench and a via opening are both formed in a dielectric layer 118, with the via opening underlying and being connected to the trench. Conductive materials are filled into the trench and the via opening to form a metal line 114 and a metal via 116, respectively. The conductive materials may include a diffusion barrier layer and a copper-containing metallic material over the diffusion barrier layer. The diffusion barrier layer may include titanium, titanium nitride, tantalum, tantalum nitride, or the like.

Top metal features 120 may be formed in a top dielectric layer 121. The top metal features 120 may be formed of the same or similar materials and by the same or similar processes to the metal lines 114 and the metal vias 116 and the top dielectric layer 121 may be formed of the same or similar materials and by the same or similar processes to the dielectric layers 118. The top dielectric layer 121 and the underlying dielectric layer 118 that is immediately underlying the top dielectric layer 121 may be formed as a single continuous dielectric layer, or may be formed as different dielectric layers using different processes, and/or formed of materials different from each other.

A first passivation layer 122 and a second passivation layer 124 may be formed over the interconnect structure 112. The first passivation layer 122 and the second passivation layer 124 may be collectively referred to as the first passivation structure. In some embodiments, the first passivation layer 122 and the second passivation layer 124 may include phospho-silicate glass (PSG), boro-silicate glass (BSG), boron-doped phospho-silicate glass (BPSG), undoped silicate glass (USG), or the like. In some embodiments, the first passivation layer 122 and the second passivation layer 124 may include an inorganic dielectric material, which may include a material selected from silicon nitride ($SiN_x$), silicon oxide ($SiO_2$), silicon oxy-nitride ($SiON_x$), silicon oxy-carbide ($SiOC_x$), silicon carbide (SiC), combinations or multiple layers thereof, or the like. The first passivation layer 122 and the second passivation layer 124 may be formed of different materials. For example, the first passivation layer 122 may comprise silicon nitride (SiN) and the second passivation layer 124 may comprise undoped silicate glass (USG). In some embodiments, the first passivation layer 122 may comprise a single layer and the second passivation layer 124 may be omitted. In some embodiments, top surfaces of the top dielectric layer 121 and the top metal features 120 are coplanar (e.g., level with one another). Accordingly, the first passivation layer 122 and the second passivation layer 124 may be planar layers. In some embodiments, the top metal features 120 protrude higher than top surfaces of the top dielectric layer 121, and the first passivation layer 122 and the second passivation layer 124 are non-planar. The first passivation layer 122 and the second passivation layer 124 may be deposited by chemical vapor deposition (CVD), physical vapor deposition (PVD), atomic layer deposition (ALD), or the like.

Figure 2:
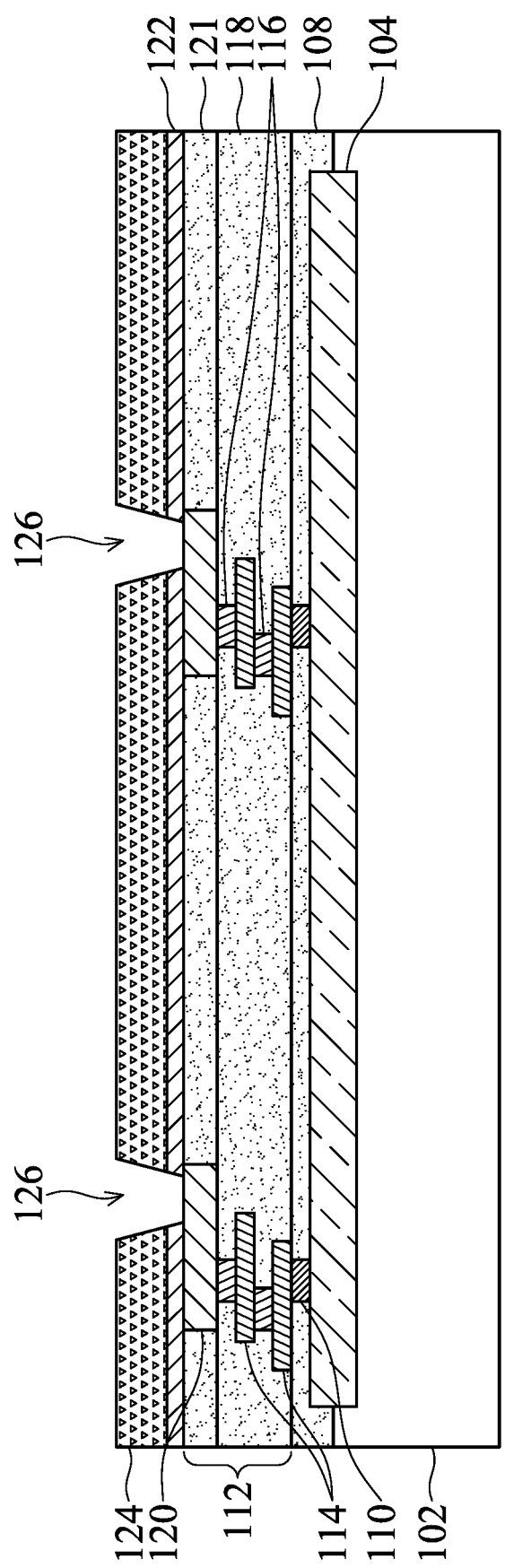

In FIG. 2, openings 126 are formed in the first passivation layer 122 and the second passivation layer 124. The openings 126 may be formed using an etching process, which may include a dry etching process. The etching process may include forming a patterned etching mask (not separately illustrated), such as a patterned photoresist, and then etching the first passivation layer 122 and the second passivation layer 124 using the patterned photoresist as a mask. The patterned etching mask is then removed. The openings 126 may be patterned through the first passivation layer 122 and the second passivation layer 124 and may expose the top metal features 120.

Figure 3:
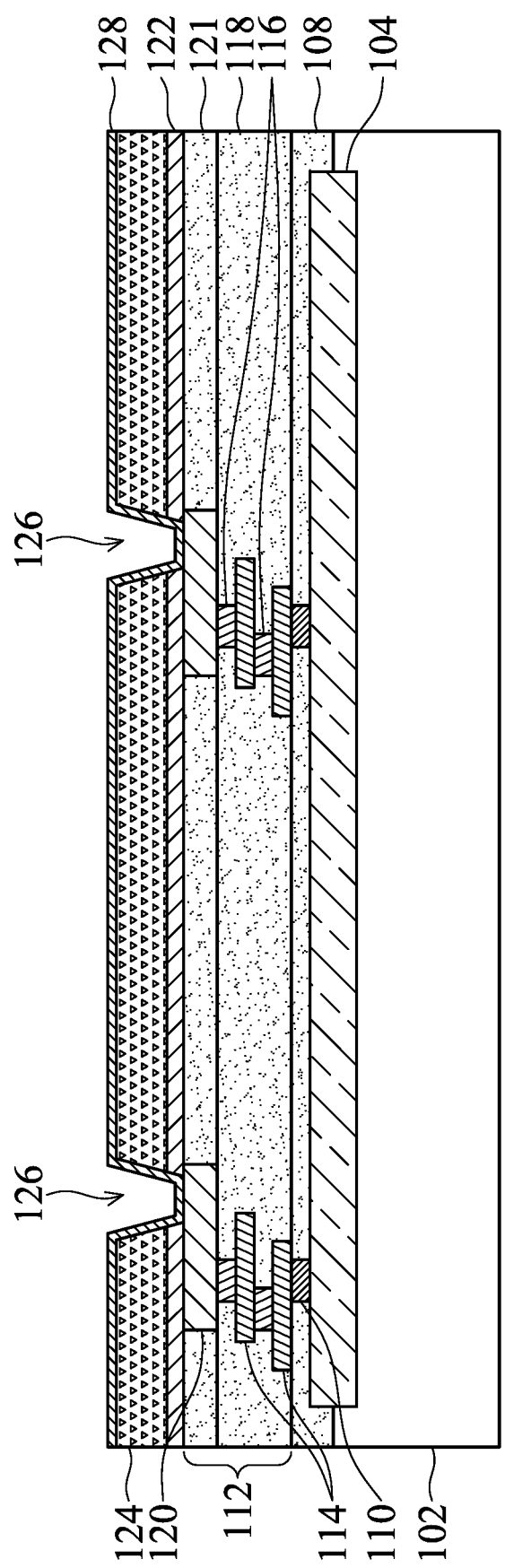

In FIG. 3, a seed layer 128 is formed over the second passivation layer 124, the first passivation layer 122, and the top metal features 120 and in the openings 126. The seed layer 128 may comprise a titanium layer and a copper layer over the titanium layer. In some embodiments, the seed layer 128 comprises a copper layer in contact with the second passivation layer 124, the first passivation layer 122, and the top metal features 120. The seed layer 128 may be formed by a deposition process such as PVD, or the like.

Figure 4:
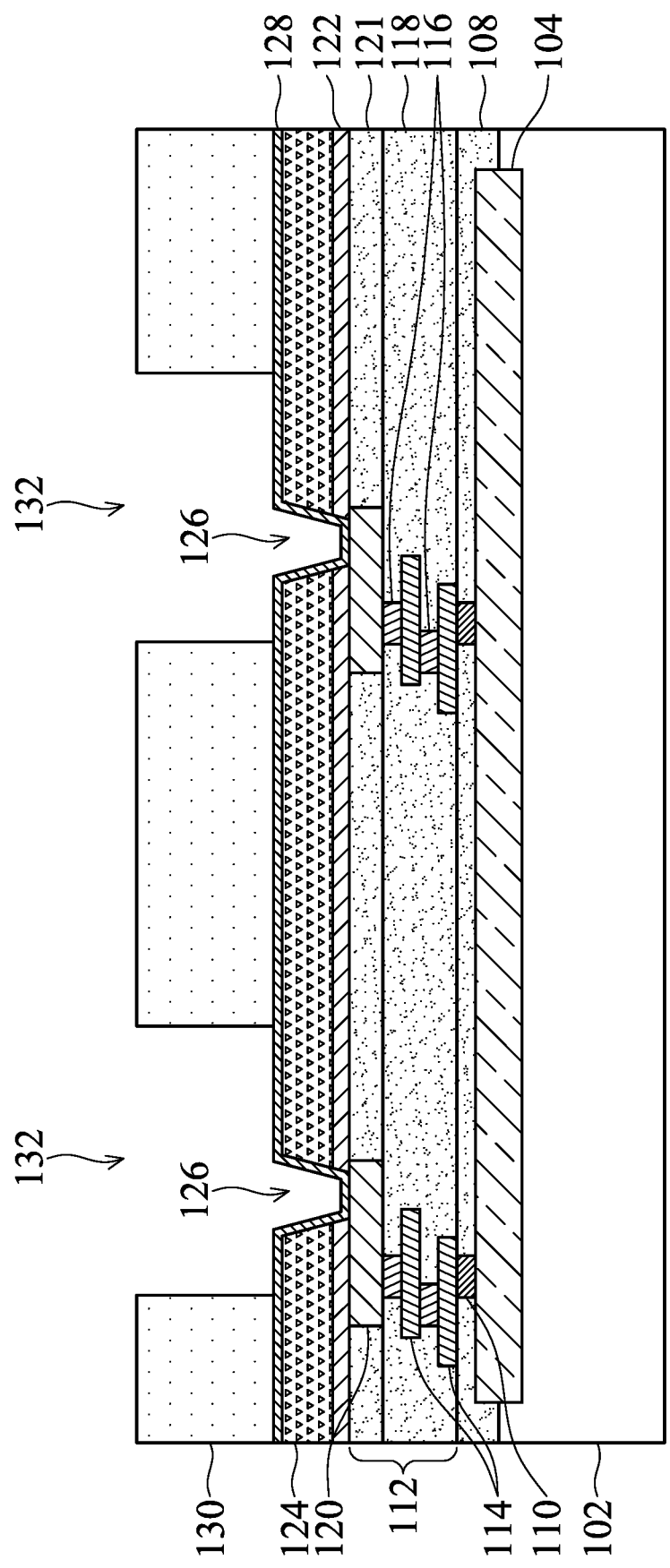

In FIG. 4, a patterned photoresist 130 is formed over the seed layer 128. The patterned photoresist 130 may be formed by depositing a photosensitive layer over the seed layer 128 using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned photoresist 130. Openings 132, which expose the seed layer 128, are formed extending through the patterned photoresist 130. The pattern of the patterned photoresist 130 corresponds to redistribution layers (RDLs) to be formed in the patterned photoresist 130, as will be discussed below with respect to FIG. 5.

Figure 5:
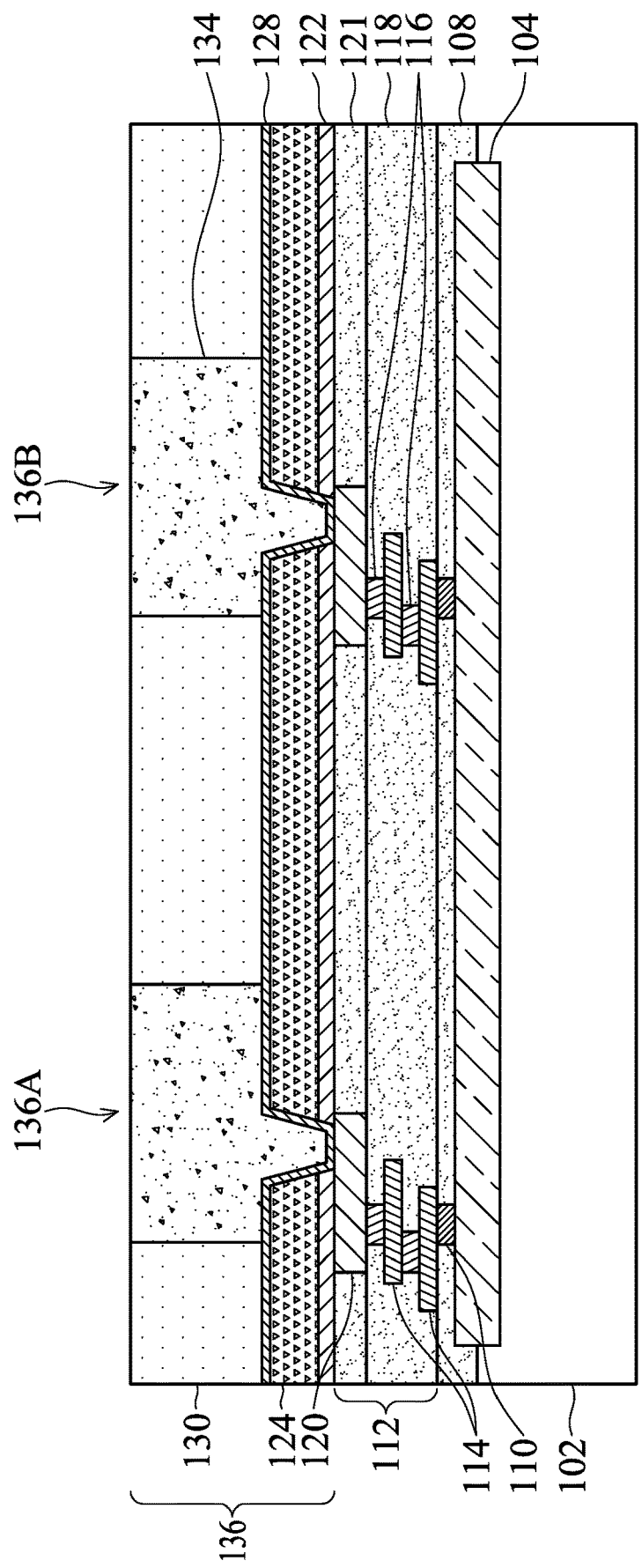

In FIG. 5, a conductive material 134 is formed over exposed portions of the seed layer 128 and filling the openings 126 and the openings 132. The conductive material 134 may be formed by plating, such as electroplating or electroless plating, or the like. The conductive material 134 may comprise a metal, such as copper, titanium, tungsten, aluminum, or the like. The combination of the conductive material 134 and underlying portions of the seed layer 128 form an RDL 136A and an RDL 136B (collectively referred to as RDLs 136). Each of the RDLs 136 may include a via portion extending through the second passivation layer 124 and the first passivation layer 122 and a trace/line portion over the second passivation layer 124. Although only two RDLs 136 are illustrated in FIG. 5, any number of RDLs 136 may be formed over each of the dies 106.

Figure 6:
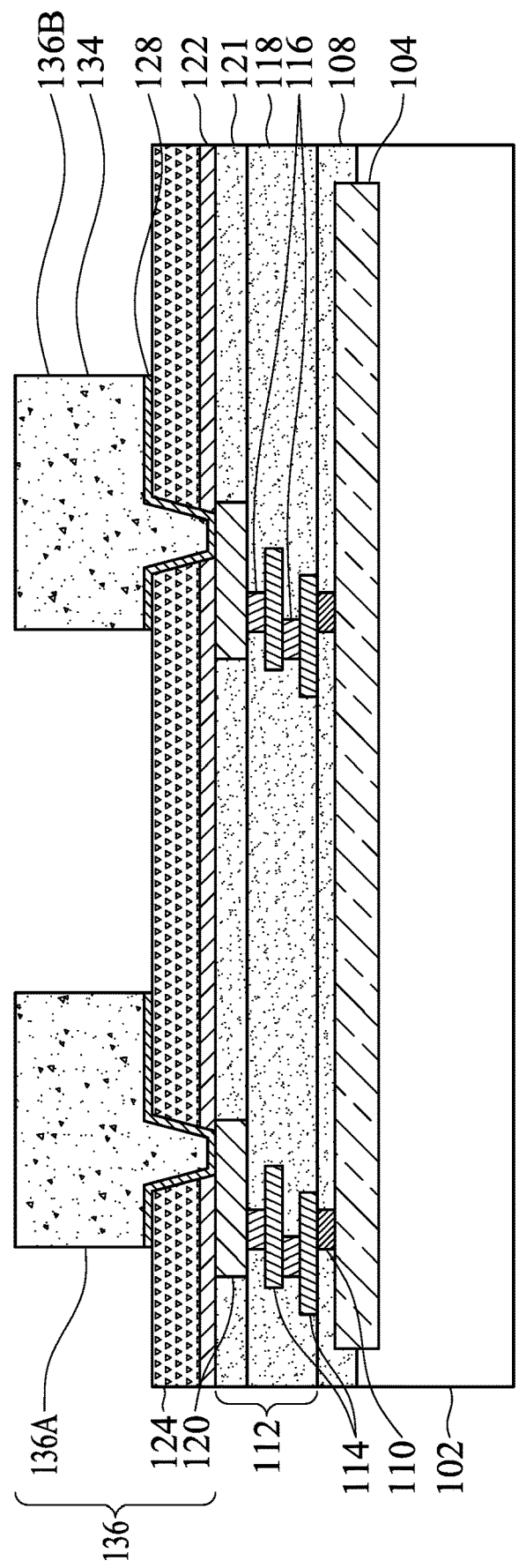

In FIG. 6, the patterned photoresist 130 and portions of the seed layer 128 on which the conductive material 134 is not formed are removed. The patterned photoresist 130 may be removed by an acceptable ashing or stripping process, such as using an oxygen plasma or the like. Once the patterned photoresist 130 is removed, exposed portions of the seed layer 128 are removed using an acceptable etching process, such as wet or dry etching.

Figure 7:
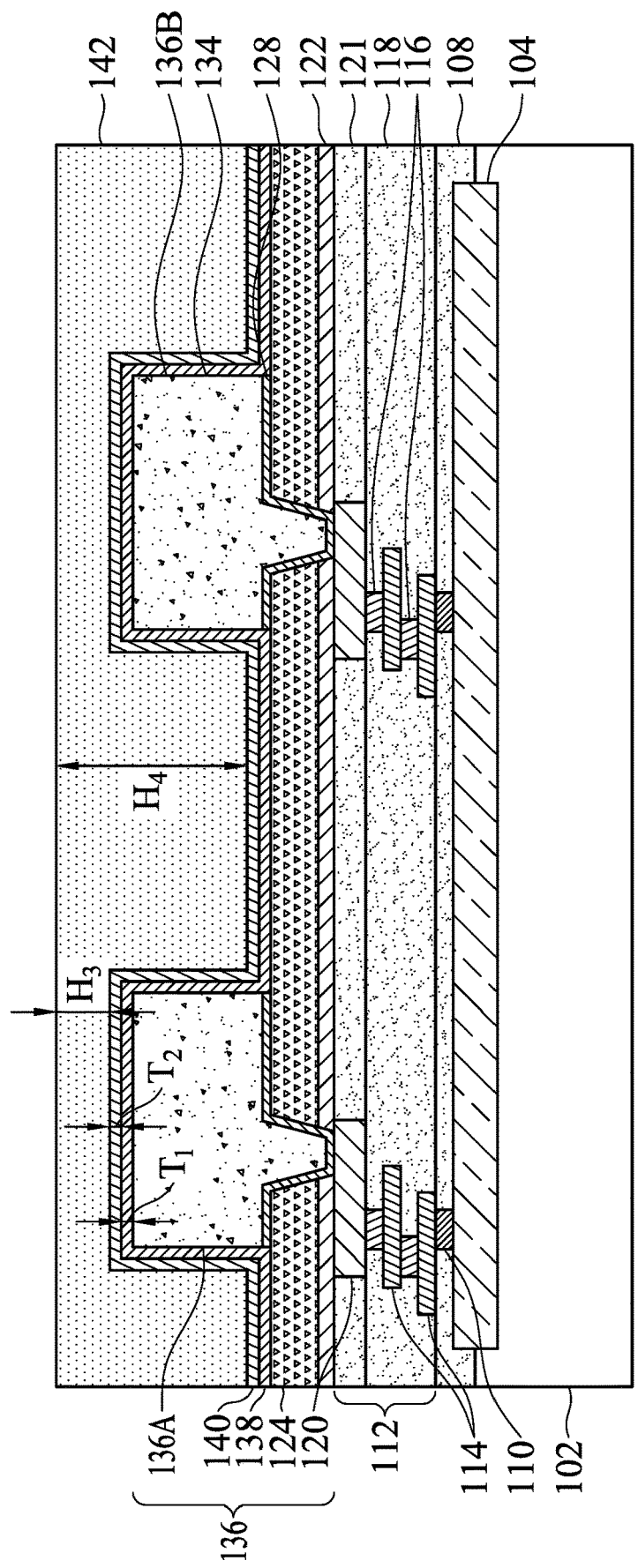

In FIG. 7, a third passivation layer 138, a fourth passivation layer 140, and a protection layer 142 are formed over the second passivation layer 124 and over and along sidewalls and top surfaces of the RDLs 136. The third passivation layer 138 and the fourth passivation layer 140 may be collectively referred to as the second passivation structure. The third passivation layer 138 and the fourth passivation layer 140 may be formed of materials the same as or different from the materials of the first passivation layer 122 and the second passivation layer 124. In some embodiments, the third passivation layer 138 and the fourth passivation layer 140 may be formed of inorganic dielectric materials, such as silicon nitride, silicon oxide, silicon oxynitride, silicon oxycarbide, silicon carbide, combinations or multiple layers thereof, or the like. In some embodiments, the third passivation layer 138 may comprise silicon oxide and the fourth passivation layer 140 may comprise silicon nitride. The third passivation layer 138 may be made of materials that have a high etching selectivity from the material of the fourth passivation layer 140, such that the third passivation layer 138 may act as an etch stop layer for a process used to etch the fourth passivation layer 140. In some embodiments, the third passivation layer 138 may comprise a single layer and the fourth passivation layer 140 may be omitted. The third passivation layer 138 and the fourth passivation layer 140 may be deposited by CVD, ALD, or the like.

In some embodiments, the third passivation layer 138 may have a thickness $T_1$ ranging from about 0.3 μm to about 2.5 μm. Providing the third passivation layer 138 with a thickness in this range provides sufficient material to electrically isolate subsequently formed dummy bumps (such as the UBM structures 150B, discussed below with respect to FIG. 10) from the RDLs 136, while minimizing the thickness of the third passivation layer 138. The fourth passivation layer 140 may have a thickness $T_2$ ranging from about 0.3 μm to about 2.5 μm.

The protection layer 142 is then formed over the fourth passivation layer 140. In some embodiments, the protection layer 142 is formed of a polymer material (which may be photosensitive) such as polyimide, polybenzoxazole (PBO), benzocyclobutene (BCB), an epoxy, or the like. The protection layer 142 may be formed by CVD, PECVD, a spin-coating process, or the like. In some embodiments, the formation of the protection layer 142 includes coating the protection layer 142 in a flowable form, and then baking to harden the protection layer 142. A planarization process, such as a CMP or a mechanical grinding process may be performed to level the top surface of the protection layer 142. The protection layer 142 may have a height $H_3$ over the RDLs 136 ranging from about 1.5 μm to about 10 μm. The protection layer 142 may further have a height $H_4$ over the second passivation layer 124 between the RDLs 136 ranging from about 4.5 μm to about 20 μm.

Figure 8:
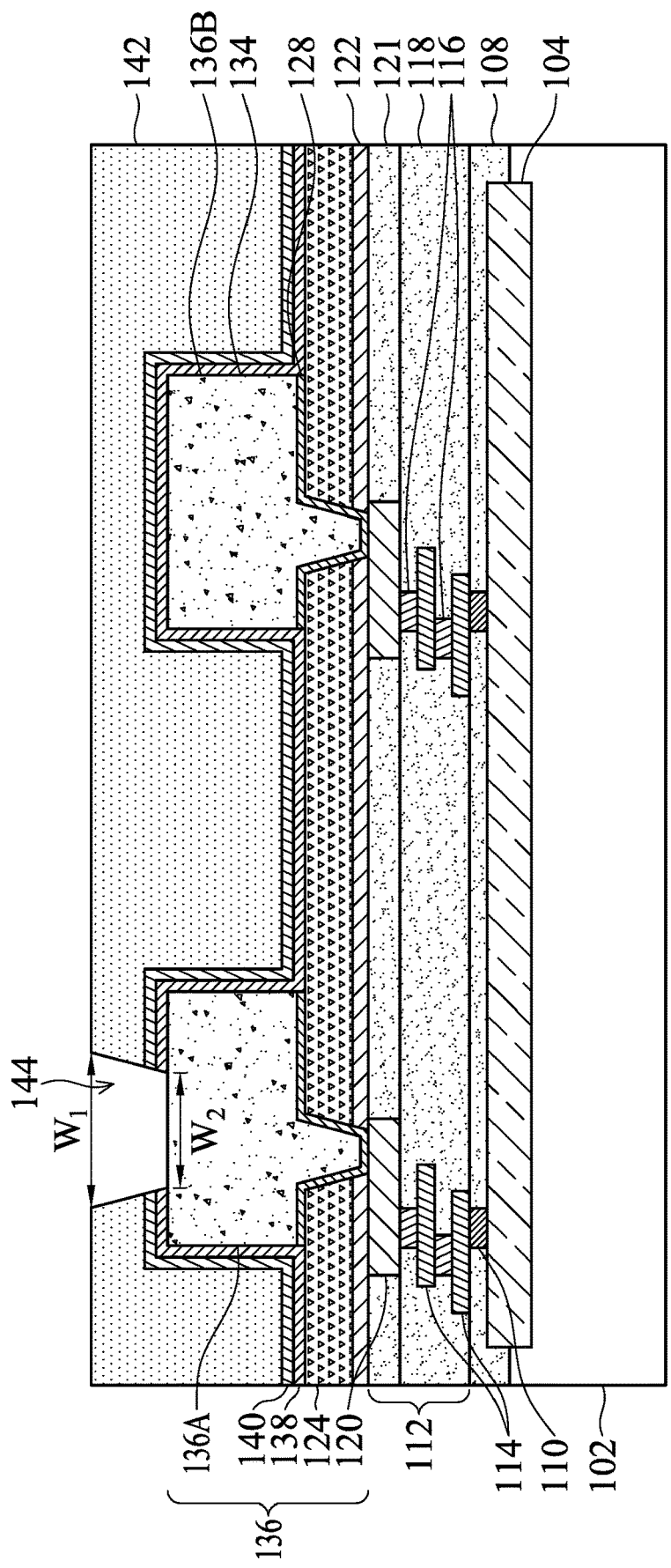

In FIG. 8, a first opening 144 is formed through the protection layer 142, the fourth passivation layer 140, and the third passivation layer 138 over the RDL 136A. In embodiments in which the protection layer 142 comprises a photosensitive material, the protection layer 142 may be patterned by exposing the protection layer 142 to a patterned energy source (e.g., a patterned light source) and developing the protection layer 142 to remove an exposed or unexposed portion of the protection layer 142, thereby forming the first opening 144. The first opening 144 may then be extended through the fourth passivation layer 140 and the third passivation layer 138 to expose the RDL 136A using the protection layer 142 as a mask. The fourth passivation layer 140 and the third passivation layer 138 may be etched using any acceptable etch process, such as a reactive ion etch (RIE), neutral beam etch (NBE), the like, or a combination thereof. The etch process may be anisotropic. As illustrated in FIG. 8, the first opening 144 may have tapered sidewalls, which narrow in a direction toward the semiconductor substrate 102. In some embodiments, the sidewalls of the first opening 144 may be substantially vertical or may be tapered and may widen in a direction toward the semiconductor substrate 102. The first opening 144 may have a width $W_1$ level with a top surface of the protection layer 142 ranging from about 5 μm to about 50 μm and a width $W_2$ level with a bottom surface of the third passivation layer 138 over the RDL 136A ranging from about 5 μm to about 50 μm.

Figure 9:
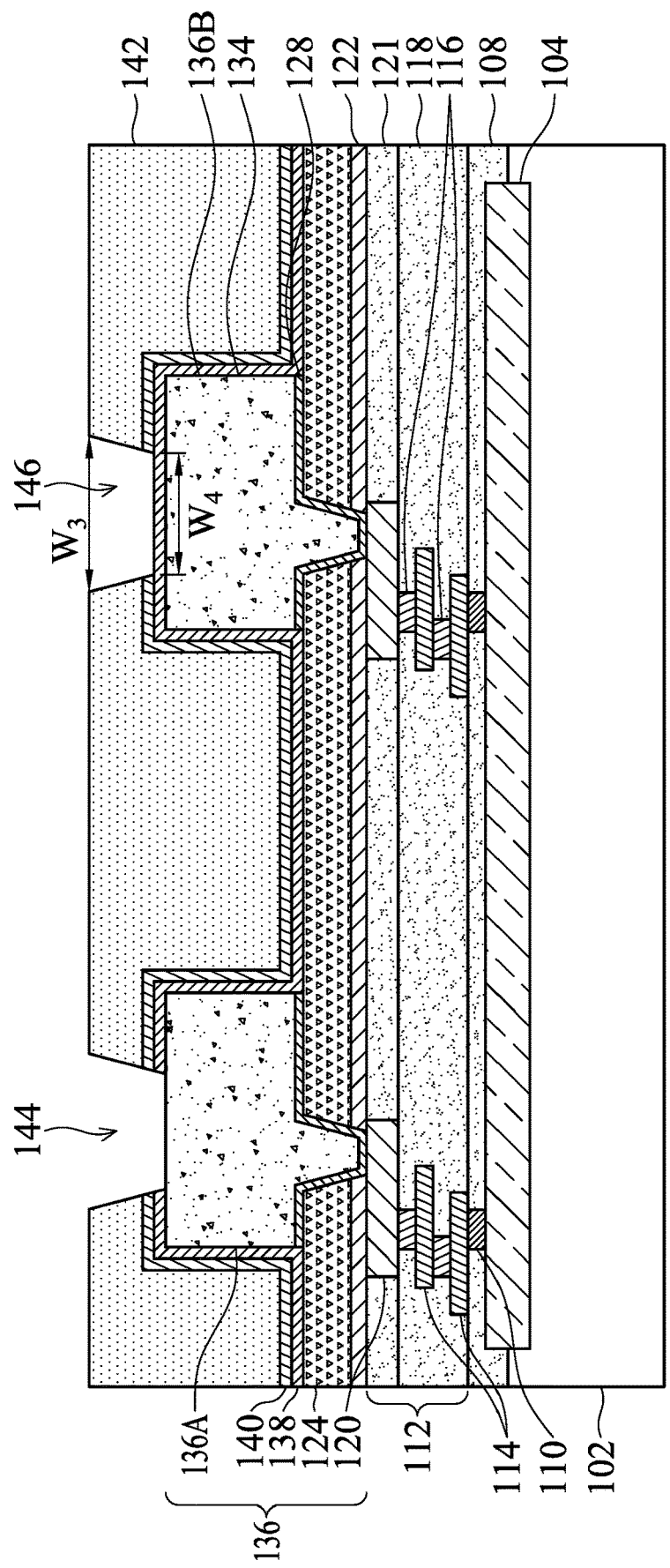

In FIG. 9, a second opening 146 is formed through the protection layer 142 and the fourth passivation layer 140 over the RDL 136B. In embodiments in which the protection layer 142 comprises a photosensitive material, the protection layer 142 may be patterned by exposing the protection layer 142 to a patterned energy source (e.g., a patterned light source) and developing the protection layer 142 to remove an exposed or unexposed portion of the protection layer 142, thereby forming the second opening 146. The second opening 146 may then be extended through the fourth passivation layer 140 using the protection layer 142 as a mask and the third passivation layer 138 as an etch stop layer. In embodiments in which the fourth passivation layer 140 is omitted, the second opening 146 may only extend through the protection layer 142. The fourth passivation layer 140 may be etched using any acceptable etch process, such as a reactive ion etch (RIE), neutral beam etch (NBE), the like, or a combination thereof. The etch process may be anisotropic. As illustrated in FIG. 9, the second opening 146 may have tapered sidewalls, which narrow in a direction toward the semiconductor substrate 102. In some embodiments, the sidewalls of the second opening 146 may be substantially vertical or may be tapered and may widen in a direction toward the semiconductor substrate 102. The second opening 146 may have a width $W_3$ level with a top surface of the protection layer 142 ranging from about 5 μm to about 50 μm and a width $W_4$ level with a bottom surface of the fourth passivation layer 140 over the RDL 136B ranging from about 5 μm to about 50 μm. The third passivation layer 138 may be substantially unetched beneath the second opening 146 such that the thickness over the RDL 136B remains in a range from about 0.5 μm to about 2.5 μm.

The protection layer 142 may then be cured using a curing process. The curing process may comprise heating the protection layer 142 to a predetermined temperature for a predetermined period of time using an anneal process or other heating process. The curing process may also comprise an ultra-violet (UV) light exposure process, an infrared (Ili) energy exposure process, combinations thereof, or a combination thereof with a heating process. Alternatively, the protection layer 142 may be cured using other methods. In some embodiments, the curing process is not included, or is performed before forming the first opening 144 and the second opening 146.

Although the second opening 146 has been described as being formed after the first opening 144, in some embodiments, the second opening 146 may be formed before the first opening 144, or at the same time as the first opening 144. For example, the same etching processes may be used to form the second opening 146 and partially form the first opening 144, and an additional etching process may be used to complete the first opening 144.

Figure 10:
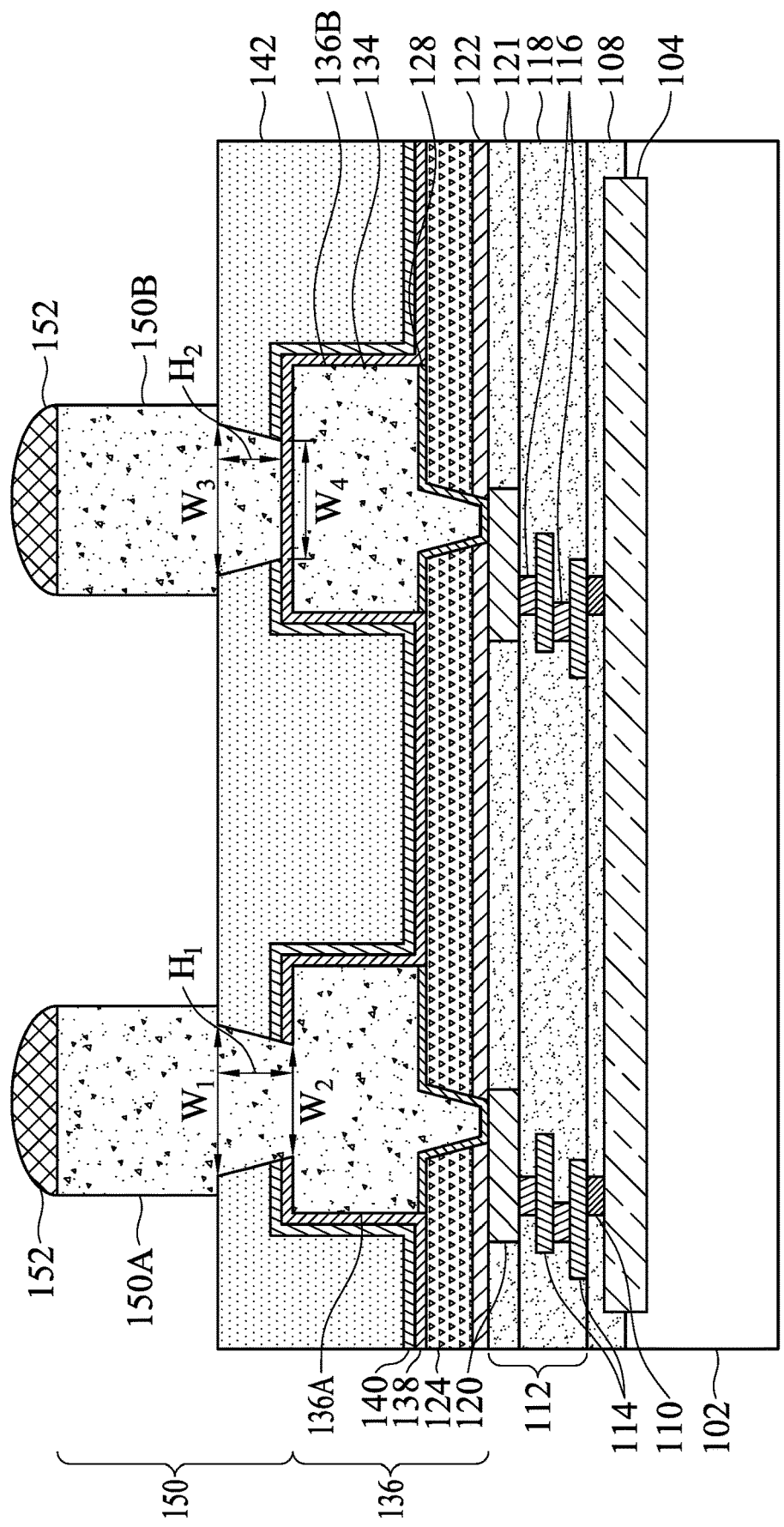

In FIG. 10, an under-bump metallization (UBM) structure 150A and a UBM structure 150B (collectively referred to as UBM structures 150) are formed over the RDL 136A and the RDL 136B, respectively. The UBM structure 150A is formed in physical contact with and electrically coupled to the RDL 136A, while the UBM structure 150B is formed over the third passivation layer 138 and electrically isolated from the RDL 136B. The UBM structures 150 may be formed by forming a seed layer (not separately illustrated) over the protective layer 142 and in the first opening 144 and the second opening 146, along side surfaces of the protective layer 142, the fourth passivation layer 140, and the third passivation layer 138 and along top surfaces of the RDL 136A (e.g., in the first opening 144) and the third passivation layer 138 (e.g., in the second opening 146). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like.

A photoresist (not separately illustrated) is then formed and patterned on the seed layer. The photoresist may be formed by spin-on coating or the like and may be exposed to a patterned energy source (e.g., a patterned light source). The photoresist may then be developed to remove an exposed or unexposed portion of the photoresist. The pattern of the photoresist corresponds to pad portions of the UBM structures 150, which extend over and along top surfaces of the protective layer 142. The patterning forms openings through the photoresist to expose the seed layer.

A conductive material is then formed over exposed portions of the seed layer and filling the openings of the photoresist. The conductive material may be formed by plating, such as electroplating or electroless plating, or the like. The conductive material may comprise a metal, such as copper, titanium, tungsten, aluminum, or the like. The combination of the conductive material and underlying portions of the seed layer form the UBM structure 150A and the UBM structure 150B. The UBM structure 150A includes a via portion extending through the protection layer 142, the fourth passivation layer 140, and the third passivation layer 138. The via portion of the UBM structure 150A is in physical contact with and electrically coupled to the RDL 136A. The via portion of the UBM structure 150A may have the width $W_1$ ranging from about 5 μm to about 50 μm at a point level with a top surface of the protection layer 142, a bottom surface of the via portion of the UBM structure 150A may have the width $W_2$ ranging from about 5 μm to about 50 μm, and a height $H_1$ of the via portion of the UBM structure 150A measured between the point level with the top surface of the protection layer 142 and the bottom surface of the via portion of the UBM structure 150A may range from about 1.5 μm to about 20 μm. The UBM structure 150B includes a via portion which extends through the protection layer 142 and the fourth passivation layer 140 and does not extend through the third passivation layer 138. The via portion of the UBM structure 150B is electrically isolated from the RDL 136B by the third passivation layer 138. The via portion of the UBM structure 150B may have the width $W_3$ ranging from about 5 μm to about 50 μm at a point level with a top surface of the protection layer 142, a bottom surface of the via portion of the UBM structure 150B may have the width $W_4$ ranging from about 5 μm to about 50 μm, and a height $H_2$ of the via portion of the UBM structure 150B measured between the point level with the top surface of the protection layer 142 and the bottom surface of the via portion of the UBM structure 150B may range from about 0.5 μm to about 20 μm. The UBM structures 150 further include pad portions extending over and along top surfaces of the protection layer 142.

The UBM structure 150B is electrically isolated from the RDL 136B and is referred to as a dummy UBM structure. Forming the UBM structure 150B with a via portion extending through the protection layer 142 and the fourth passivation layer 140 such that the via portion is in contact with sidewalls of the protection layer 142 and the fourth passivation layer 140 and a top surface of the third passivation layer 138 increases the contact area between the UBM structure 150B and the underlying dielectric structures, which improves adhesion of the UBM structure 150B and increases shear strength of the UBM structure 150B. Moreover, because the UBM structure 150B is electrically isolated from the RDL 136B, the RDL 136B may be an active RDL, which allows more space to be used for routing the RDLs 136. Further, electrically isolating the UBM structure 150B from the RDL 136B allows for more dummy UBM structures 150B to be formed, which provides more bump contact area and allows stronger connections to be made between the UBM structures 150 and other semiconductor devices. For example, the UBM structures 150 may be formed with pitches ranging from about 10 μm to about 150 μm.

After forming the UBM structures 150, conductive connectors 152 are formed on the UBM structures 150. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 152 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11:
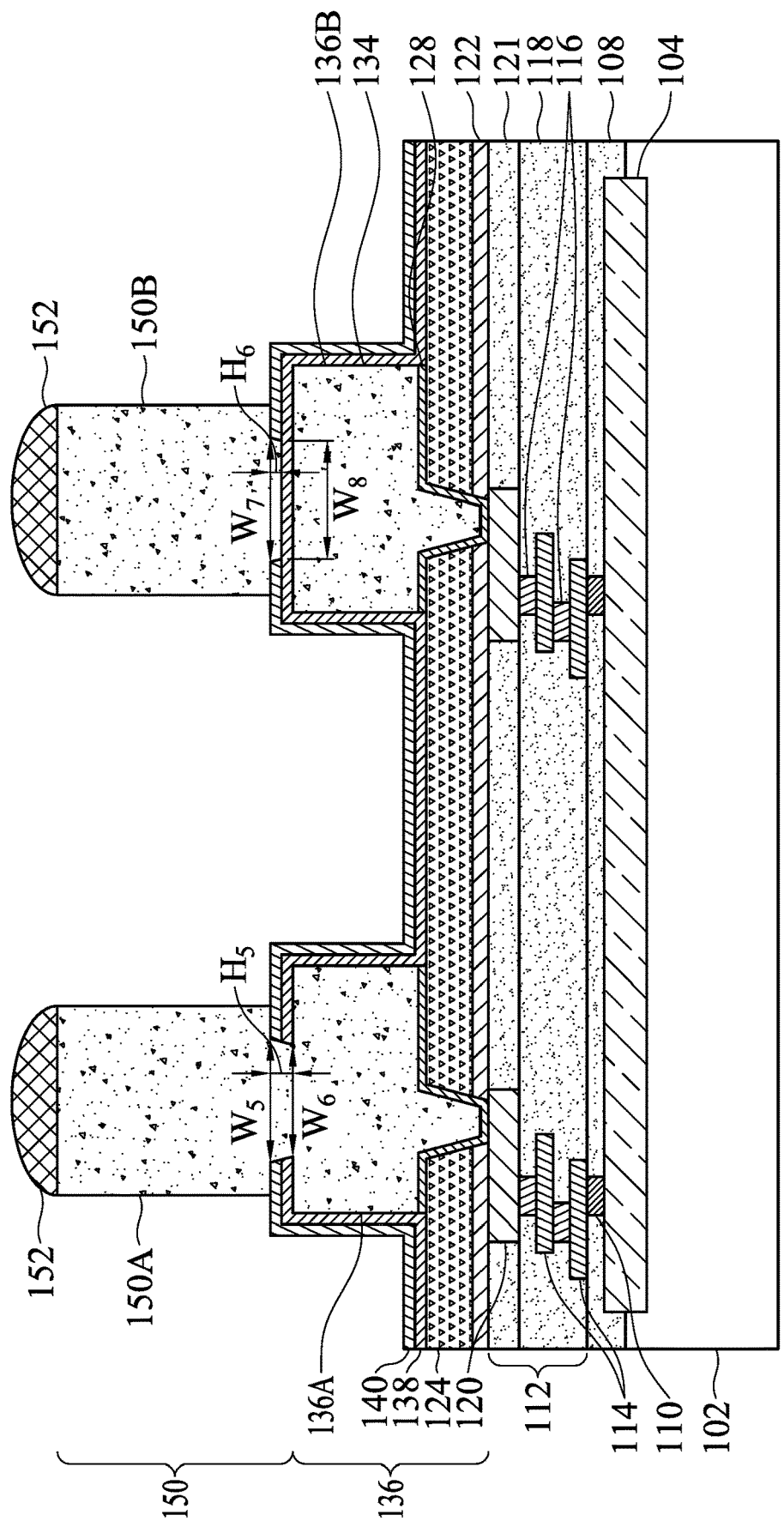

FIG. 11 illustrates an embodiment in which the protection layer 142 is omitted. In the embodiment illustrated in FIG. 11, the UBM structure 150A includes a via portion extending through the fourth passivation layer 140 and the third passivation layer 138 to physically contact and be electrically coupled with the RDL 136A. The via portion of the UBM structure 150A may have a width $W_5$ ranging from about 5 μm to about 50 μm at a point level with a top surface of the fourth passivation layer 140, a bottom surface of the via portion of the UBM structure 150A may have a width $W_6$ ranging from about 5 μm to about 50 μm, and the via portion of the UBM structure 150A may have a height $H_5$ ranging from about 1 μm to about 20 μm measured between the point level with the top surface of the fourth passivation layer 140 and the bottom surface of the via portion of the UBM structure 150A. The UBM structure 150B includes a via portion extending through the fourth passivation layer 140 without extending through the third passivation layer 138. The UBM structure 150B is electrically isolated from the RDL 136B by the third passivation layer 138. The via portion of the UBM structure 150B may have a width $W_7$ ranging from about 5 μm to about 50 μm at a point level with a top surface of the fourth passivation layer 140, a bottom surface of the via portion of the UBM structure 150B may have a width $W_8$ ranging from about 5 μm to about 50 μm, and the via portion of the UBM structure 150B may have a height $H_6$ ranging from about 0.5 μm to about 20 μm measured between the point level with the top surface of the fourth passivation layer 140 and the bottom surface of the via portion of the UBM structure 150B. The UBM structures 150 include pad portions extending over and along top surfaces of the fourth passivation layer 140. The protection layer 142 may be omitted in embodiments in which the width $W_5$ and the width $W_7$ are relatively small (e.g., less than about 5 μm). Omitting the protection layer 142 may reduce aspect ratios (e.g., ratios of the heights to the widths) of openings in which the via portions of the UBM structures 150 are formed, which allows for the UBM structures 150 to be more easily formed and prevents voids or other inconsistencies from being formed in the UBM structures 150. This reduces device defects and improves device performance.

Figure 12:
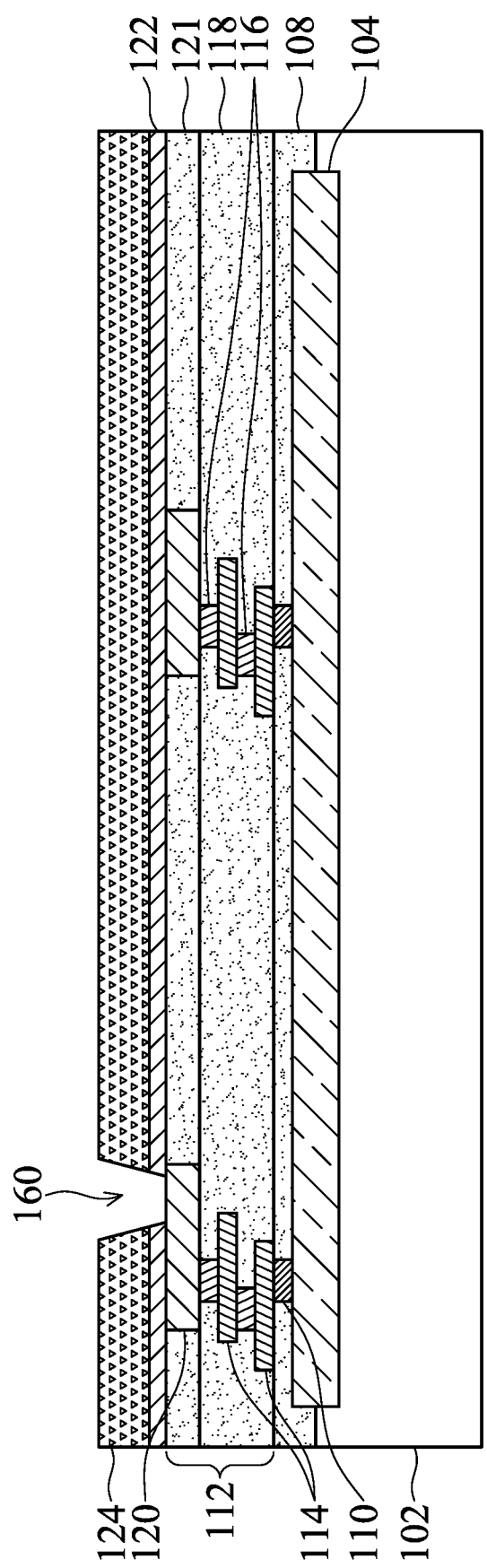

FIGS. 12 through 18 illustrate an embodiment in which UBM structures 180 and 182 are formed over an RDL 166 and conductive traces 168 (illustrated in FIG. 17), respectively, rather than being formed over the RDLs 136. In FIG. 12, an opening 160 is formed extending through the second passivation layer 124 and the first passivation layer 122 of the structure illustrated in FIG. 1. The opening 160 may be formed by methods similar to or the same as those used to form the openings 126 discussed above and illustrated with respect to FIG. 2.

Figure 13:
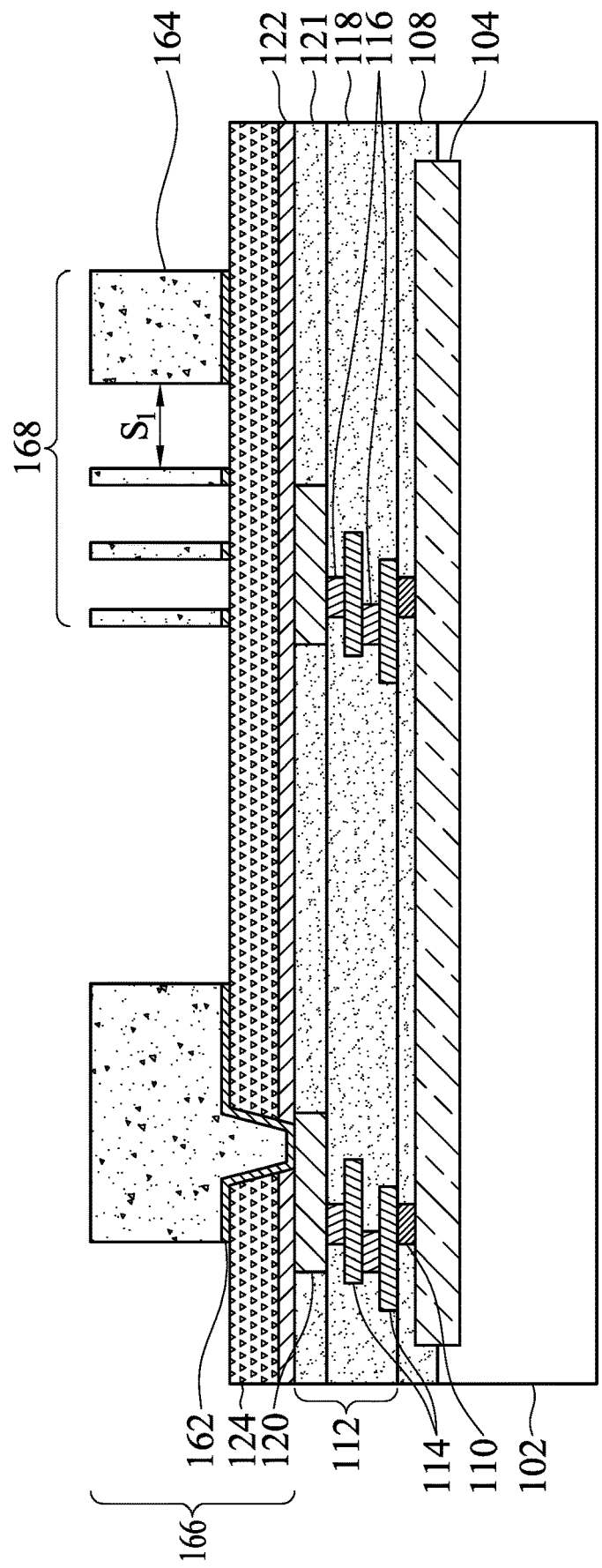

In FIG. 13, an RDL 166 and conductive traces 168 are formed over the second passivation layer 124. The RDL 166 and the conductive traces 168 are formed by first forming a seed layer 162 over the second passivation layer 124, the first passivation layer 122, and the top of one of the top metal features 120 and in the opening 160. The seed layer 162 may comprise a titanium layer and a copper layer over the titanium layer. In some embodiments, the seed layer 162 comprises a copper layer in contact with the second passivation layer 124, the first passivation layer 122, and the top metal feature 120. The seed layer 162 may be formed by a deposition process such as PVD, or the like.

A patterned photoresist (not separately illustrated) is then formed over the seed layer 162. The patterned photoresist may be formed by depositing a photosensitive layer over the seed layer 162 using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned photoresist. Openings, which expose the seed layer 162, are formed extending through the patterned photoresist. The pattern of the patterned photoresist 130 corresponds to the RDL 166 and the conductive traces 168 to be formed in the patterned photoresist.

A conductive material 164 is formed over exposed portions of the seed layer 162 and filling the opening 160 and the openings formed in the patterned photoresist. The conductive material 164 may be formed by plating, such as electroplating or electroless plating, or the like. The conductive material 164 may comprise a metal, such as copper, titanium, tungsten, aluminum, or the like. The combination of the conductive material 164 and underlying portions of the seed layer 162 form RDL 166 and the conductive traces 168. The RDL 166 may include a via portion extending through the second passivation layer 124 and the first passivation layer 122 and a trace/line portion over the second passivation layer 124. In some embodiments, the conductive traces 168 may only include trace/line portions over the second passivation layer 124. Although one RDL 166 and four conductive traces 168 are illustrated in FIG. 13, any number of RDLs 166 and conductive traces 168 may be formed over each of the dies 106.

The spacing $S_1$ between adjacent ones of the conductive traces 168 may be greater than about 1.0 μm. Ensuring that the spacing $S_1$ between adjacent ones of the conductive traces 168 is greater than this minimum value ensures that a seed layer used for subsequently formed UBM structures (such as the UBM structures 182, discussed below with respect to FIG. 17) can be depositing in an opening (such as the second openings 178, discussed below with respect to FIG. 16) extending between adjacent ones of the conductive traces 168.

The patterned photoresist and portions of the seed layer 162 on which the conductive material 164 is not formed are then removed. The patterned photoresist may be removed by an acceptable ashing or stripping process, such as using an oxygen plasma or the like. Once the patterned photoresist is removed, exposed portions of the seed layer 162 are removed using an acceptable etching process, such as wet or dry etching.

Figure 14:
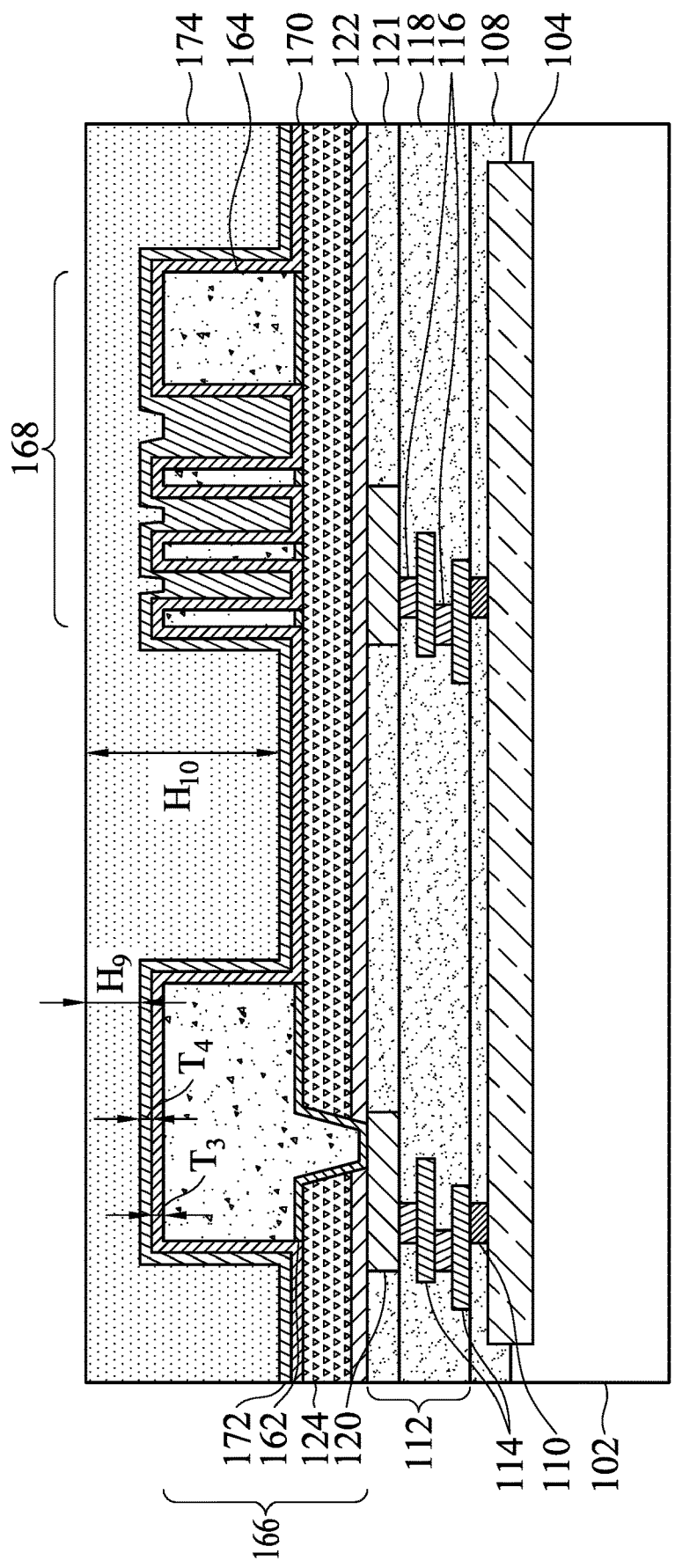

In FIG. 14, a third passivation layer 170, a fourth passivation layer 172, and a protection layer 174 are formed over the second passivation layer 124, the RDL 166, and the conductive traces 168. The third passivation layer 170 and the fourth passivation layer 172 may be collectively referred to as passivation-2 or pass-2. The third passivation layer 170 and the fourth passivation layer 172 may be formed of materials the same as or different from the materials of the third passivation layer 138 and the fourth passivation layer 140. In some embodiments, the third passivation layer 170 and the fourth passivation layer 172 may be formed of inorganic dielectric materials, such as silicon nitride, silicon oxide, silicon oxynitride, silicon oxycarbide, silicon carbide, combinations or multiple layers thereof, or the like. In some embodiments, the third passivation layer 170 may comprise silicon oxide and the fourth passivation layer 172 may comprise silicon nitride. The third passivation layer 170 may be made of materials that have a high etching selectivity from the material of the fourth passivation layer 172, such that the third passivation layer 170 may act as an etch stop layer for a process used to etch the fourth passivation layer 172. In some embodiments, the third passivation layer 170 may comprise a single layer and the fourth passivation layer 172 may be omitted. The third passivation layer 170 and the fourth passivation layer 172 may be deposited by CVD, ALD, or the like.

As illustrated in FIG. 14, both the third passivation layer 170 and the fourth passivation layer 172 may be conformally deposited. Portions of the fourth passivation layer 172 disposed between adjacent ones of the conductive traces 168 may merge with one another. Top portions of the fourth passivation layer 172 may remain unmerged, such that dimples are formed in the fourth passivation layer 172 between adjacent ones of the conductive traces 168. Bottom surfaces of the dimples in the fourth passivation layer 172 may be disposed below top surfaces of the conductive traces 168, as illustrated in FIG. 14, or the bottom surfaces of the dimples in the fourth passivation layer 172 may be disposed level with or above the top surfaces of the conductive traces 168. In some embodiments, the portions of the fourth passivation layer 172 disposed between adjacent ones of the conductive traces 168 may be merged such that top surfaces of the fourth passivation layer 172 between adjacent ones of the conductive traces 168 are substantially flat or planar.

In some embodiments, the third passivation layer 170 may have a thickness $T_3$ over the RDL 166 and the conductive traces 168 ranging from about 0.3 μm to about 2.5 μm. Providing the third passivation layer 170 with a thickness in this range provides sufficient material to electrically isolate subsequently formed dummy bumps (such as the UBM structures 182, discussed below with respect to FIG. 17) from the conductive traces 168, while minimizing the thickness of the third passivation layer 170. The fourth passivation layer 172 may have a thickness $T_4$ over the RDL 166 and the conductive traces 168 ranging from about 0.3 μm to about 2.5 μm.

The protection layer 174 is then formed over the fourth passivation layer 172. In some embodiments, the protection layer 174 is formed of a polymer material (which may be photosensitive) such as polyimide, polybenzoxazole (PBO), benzocyclobutene (BCB), an epoxy, or the like. The protection layer 174 may be formed by CVD, PECVD, a spin-coating process, or the like. In some embodiments, the formation of the protection layer 174 includes coating the protection layer 174 in a flowable form, and then baking to harden the protection layer 174. A planarization process, such as a CMP or a mechanical grinding process may be performed to level the top surface of the protection layer 174. The protection layer 174 may have a height $H_9$ over the RDL 166 and the conductive traces 168 ranging from about 1.5 µm to about 10 µm. The protection layer 174 may further have a height $H_{10}$ over the second passivation layer 124 between the RDL 166 and the conductive traces 168 ranging from about 1.5 µm to about 10 µm. As illustrated in FIG. 14, both the third passivation layer 170 and the fourth passivation layer 172 may be formed between adjacent ones of the conductive traces 168. The protection layer 174 may fill any dimples in the fourth passivation layer between adjacent ones of the conductive traces 168.

Figure 15:
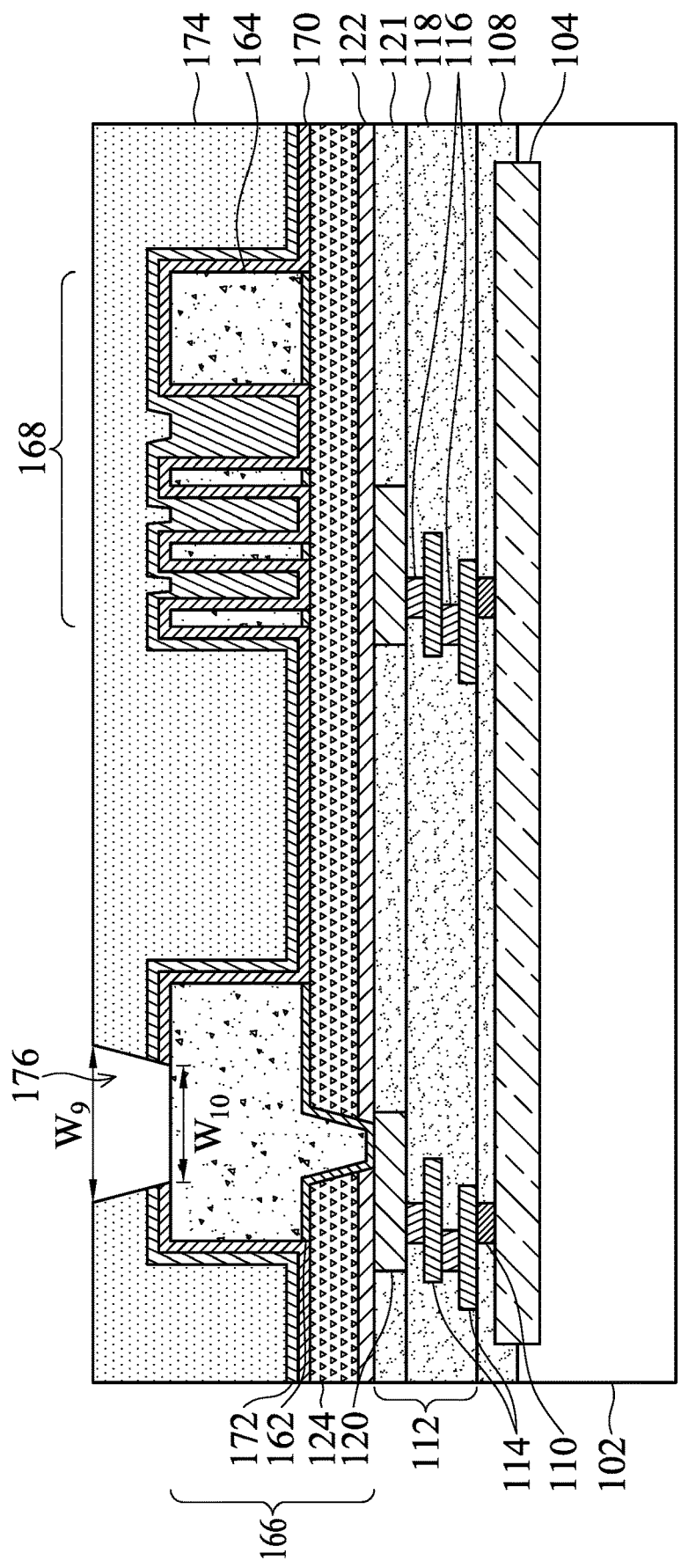

In FIG. 15, a first opening 176 is formed through the protection layer 174, the fourth passivation layer 172, and the third passivation layer 170 over the RDL 166. In embodiments in which the protection layer 174 comprises a photosensitive material, the protection layer 174 may be patterned by exposing the protection layer 174 to a patterned energy source (e.g., a patterned light source) and developing the protection layer 174 to remove an exposed or unexposed portion of the protection layer 174, thereby forming the first opening 176. The first opening 176 may then be extended through the fourth passivation layer 172 and the third passivation layer 170 to expose the RDL 166 using the protection layer 174 as a mask. The fourth passivation layer 172 and the third passivation layer 170 may be etched using any acceptable etch process, such as a reactive ion etch (RIE), neutral beam etch (NBE), the like, or a combination thereof. The etch process may be anisotropic. As illustrated in FIG. 15, the first opening 176 may have tapered sidewalls, which narrow in a direction toward the semiconductor substrate 102. In some embodiments, the sidewalls of the first opening 176 may be substantially vertical or may be tapered and may widen in a direction toward the semiconductor substrate 102. The first opening 176 may have a width $W_9$ level with a top surface of the protection layer 174 ranging from about 5 µm to about 50 µm and a width $W_{10}$ level with a bottom surface of the third passivation layer 170 over the RDL 166 ranging from about 5 µm to about 50 µm.

Figure 16:
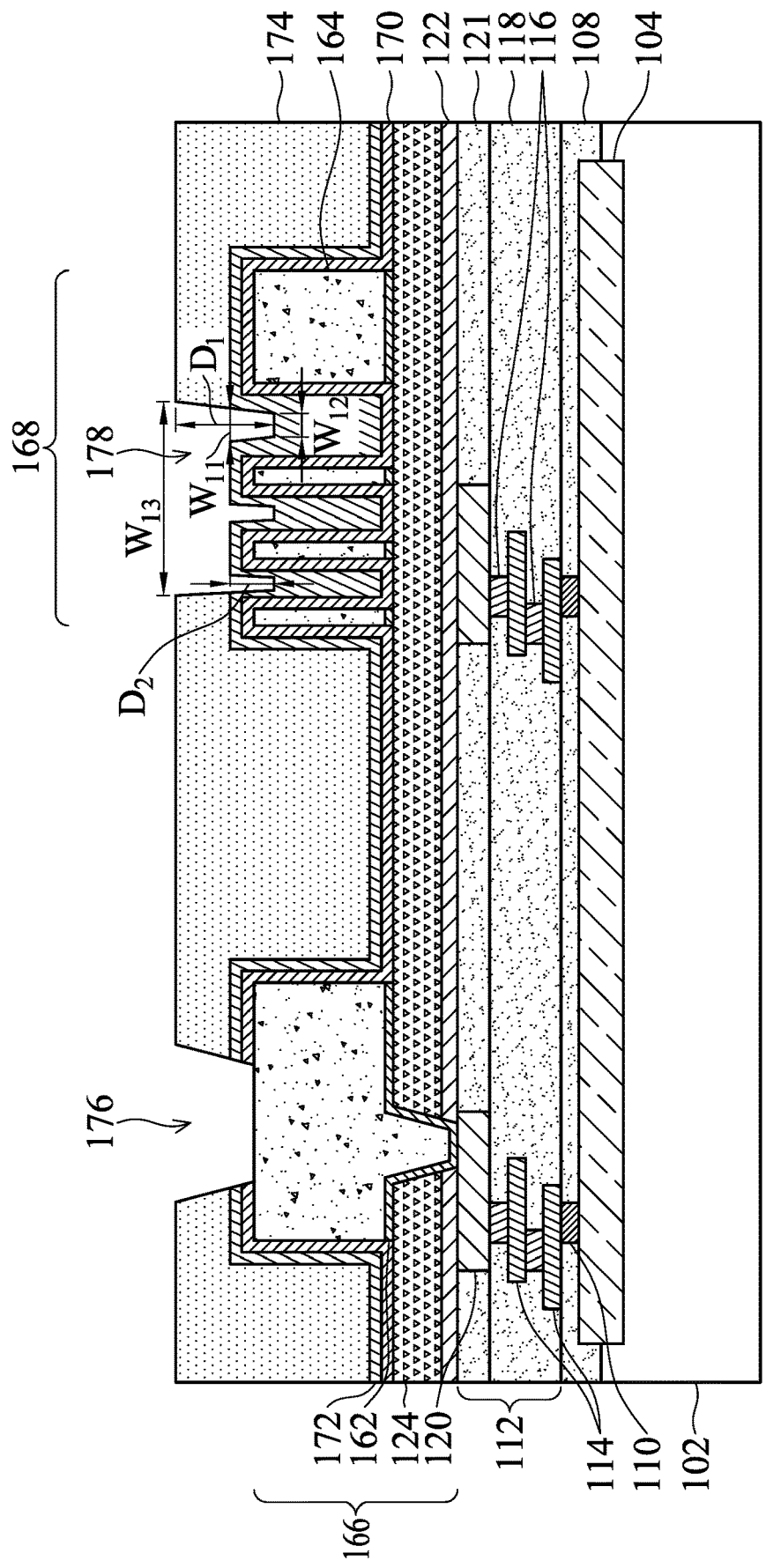

In FIG. 16, second openings 178 are formed through the protection layer 174 and at least partially through the fourth passivation layer 172 between adjacent ones of the conductive traces 168. In embodiments in which the protection layer 174 comprises a photosensitive material, the protection layer 174 may be patterned by exposing the protection layer 174 to a patterned energy source (e.g., a patterned light source) and developing the protection layer 174 to remove an exposed or unexposed portion of the protection layer 174, thereby forming the second openings 178. The second openings 178 may then be extended through the fourth passivation layer 172 using the protection layer 174 as a mask. In some embodiments, an additional mask may be deposited in the second openings 178, patterned, and used as a mask to extend the second openings 178 into the fourth passivation layer 172. Although the second openings 178 are only illustrated as extending through the protection layer 174 and portions of the fourth passivation layer 172, in some embodiments, the second openings 178 may also extend through portions of the third passivation layer 170. In some embodiments, the third passivation layer 170 may act as an etch stop layer. In embodiments in which the fourth passivation layer 172 is omitted, the second openings 178 may only extend through the protection layer 174. The fourth passivation layer 172 may be etched using any acceptable etch process, such as a reactive ion etch (RIE), neutral beam etch (NBE), the like, or a combination thereof. The etch process may be anisotropic.

As illustrated in FIG. 16, the second openings 178 may have tapered sidewalls, which narrow in a direction toward the semiconductor substrate 102. In some embodiments, the sidewalls of the second openings 178 may be substantially vertical or may be tapered and may widen in a direction toward the semiconductor substrate 102. Portions of the second openings 178 extending through the protection layer 174 may have relatively large widths, while portions of the second openings 178 extending into the fourth passivation layer 172 may have relatively narrow widths. The second openings 178 may have widths $W_{13}$ level with a top surface of the protection layer 174 ranging from about 5 µm to about 60 µm, may have widths $W_{11}$ level with top surfaces of the fourth passivation layer 172 ranging from about 1.3 µm to about 10 µm, and bottom surfaces of the second openings 178 may have widths $W_{12}$ ranging from about 0.8 µm to about 9.0 µm. The second openings 178 may have depths $D_1$ ranging from about 0.2 µm to about 5.0 µm and the portions of the second openings 178 extending into the fourth passivation layer 172 may have depths $D_2$ ranging from about 0.1 µm to about 3.0 µm. The third passivation layer 170 may be substantially unetched by the processes used to form the second openings 178 such that thicknesses of the third passivation layer 170 between the conductive traces 168 and the second openings 178 are at least from about 1.0 µm to about 2.5 µm.

Figure 17:
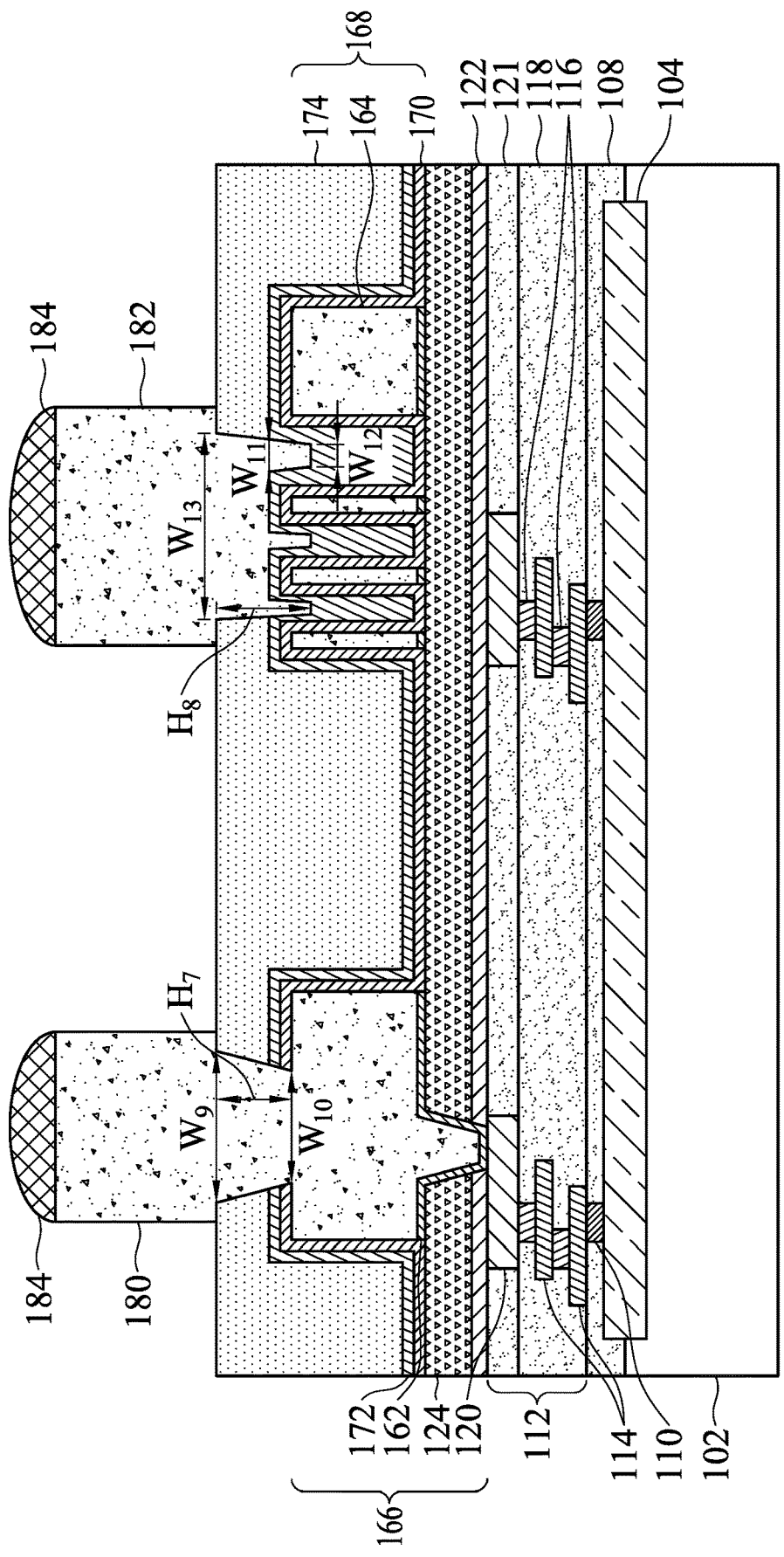

In FIG. 17, a UBM structure 180 and a UBM structure 182 are formed over the RDL 166 and the conductive traces 168, respectively. The UBM structure 180 is formed in physical contact with and electrically coupled to the RDL 166. At least portions of the third passivation layer 170 are between the UBM structure 182 and the conductive traces 168 such that the UBM structure 182 is electrically isolated from the conductive traces 168. The UBM structure 180 is formed by forming a seed layer (not separately illustrated) over the protection layer 174 and in the first opening 176, along sidewalls of the protection layer 174, the fourth passivation layer 172, and the third passivation layer 170 and along top surfaces of the RDL 166. The UBM structure 182 is formed by forming a seed layer (not separately illustrated) over the protection layer 174 and in the second opening 178, along sidewalls of the protection layer 174 and the fourth passivation layer 172, and along top surfaces of the fourth passivation layer 172. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like.

After forming the seed layer, a photoresist (not separately illustrated) is formed and patterned on the seed layer. The photoresist may be formed by spin-on coating or the like and may be exposed to a patterned energy source (e.g., a patterned light source). The photoresist may then be developed to remove an exposed or unexposed portion of the photoresist. The pattern of the photoresist corresponds to pad portions of the UBM structures 180 and 182, which extend over and along top surfaces of the protection layer 174. The patterning forms openings through the photoresist to expose the seed layer.

A conductive material is then formed over exposed portions of the seed layer and filling the openings of the photoresist. The conductive material may be formed by plating, such as electroplating or electroless plating, or the like. The conductive material may comprise a metal, such as copper, titanium, tungsten, aluminum, or the like. The combination of the conductive material and underlying portions of the seed layer form the UBM structures 180 and 182. The UBM structure 180 includes a via portion extending through the protection layer 174, the fourth passivation layer 172, and the third passivation layer 170 and in physical contact with and electrically coupled to the RDL 166. The via portion of the UBM structure 180 may have the width $W_9$ ranging from about 5 μm to about 50 μm at a point level with a top surface of the protection layer 174, the width $W_{10}$ ranging from about 5 μm to about 50 μm at a point level with a bottom surface of the third passivation layer 170 over the RDL 166, and a height $H_7$ ranging from about 1.5 μm to about 20 μm measured between the point level with the top surface of the protection layer 174 and the point level with the bottom surface of the third passivation layer 170 over the RDL 166. The via portions of the UBM structure 180 are in physical contact with side surfaces of the protection layer 174, side surfaces of the fourth passivation layer 172, side surfaces of the third passivation layer 170, and a top surface of the RDL 166. The UBM structure 180 further includes a pad portion extending over and along top surfaces of the protection layer 174.

The UBM structure 182 includes via portions, which extend through the protection layer 174 and may further extend through portions of the fourth passivation layer 172 and the third passivation layer 170. The via portions of the UBM structure 182 are disposed between adjacent ones of the conductive traces 168. The UBM structure 182 is electrically isolated from the conductive traces 168 by at least portions of the third passivation layer 170. The via portions of the UBM structure 182 may have the widths $W_{13}$ ranging from about 5 μm to about 60 μm at points level with top surfaces of the protection layer 174, the widths $W_{11}$ level with top surfaces of the fourth passivation layer 172 ranging from about 1.3 μm to about 10 μm, and bottom surfaces of the via portions of the UBM structure 182 may have the widths $W_{12}$ ranging from about 0.8 μm to about 9.0 μm. A height $H_8$ of the via portions of the UBM structure 182 may range from about 0.2 μm to about 5.0 μm measured between the point level with the top surface of the protection layer 174 and the bottom surfaces of the via portions of the UBM structure 182. In some embodiments, the via portions of the UBM structure 182 are in physical contact with side surfaces of the protection layer 174, side surfaces of the fourth passivation layer 172, and a top surface of the fourth passivation layer 172. In some embodiments, the via portions of the UBM structure 182 are in physical contact with side surfaces of the protection layer 174, side surfaces of the fourth passivation layer 172, side surfaces of the third passivation layer 170, and a top surface of the fourth passivation layer 172. The UBM structure 182 further includes a pad portion extending over and along top surfaces of the protection layer 174. Although three via portions are illustrated as extending from the pad portion of the UBM structure 182, any number of via portions, such as more than three, two, or one via portion may extend from the pad portion of the UBM structure 182. The UBM structures 180 and 182 may have pitches ranging from about 10 μm to about 150 μm.

The UBM structure 182 is electrically isolated from the conductive traces 168 and may be referred to as a dummy UBM structure. The UBM structure 182 is formed with one or more via portions, which extend below top surfaces of the conductive traces 168, which allows for the contact area between the UBM structure 182 and the underlying layers (e.g., the protection layer 174, the fourth passivation layer 172, and the third passivation layer 170) to be increased, which improves adhesion of the UBM structure and increases shear strength of the UBM structure 182. Including multiple via portions for a single UBM structure 182 further improves the shear strength of the UBM structure 182. This reduces device defects and improves device performance. The UBM structure 182 is electrically isolated from the conductive traces 168 by at least the third passivation layer 170, which allows for the conductive traces 168 to be routed under the dummy UBM structure 182, which increases the routing space available. This reduces device area and simplifies device layout. Moreover, a greater number of dummy UBM structures 182 may be formed, which provides more bump contact area and allows for stronger connections to be made to other semiconductor devices.

After forming the UBM structures 180 and 182, conductive connectors 184 are formed on the UBM structures 180 and 182. The conductive connectors 184 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 184 may include a conductive material such as solder, copper, aluminum, gold, nickel, silver, palladium, tin, the like, or a combination thereof. In some embodiments, the conductive connectors 184 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 184 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 18:
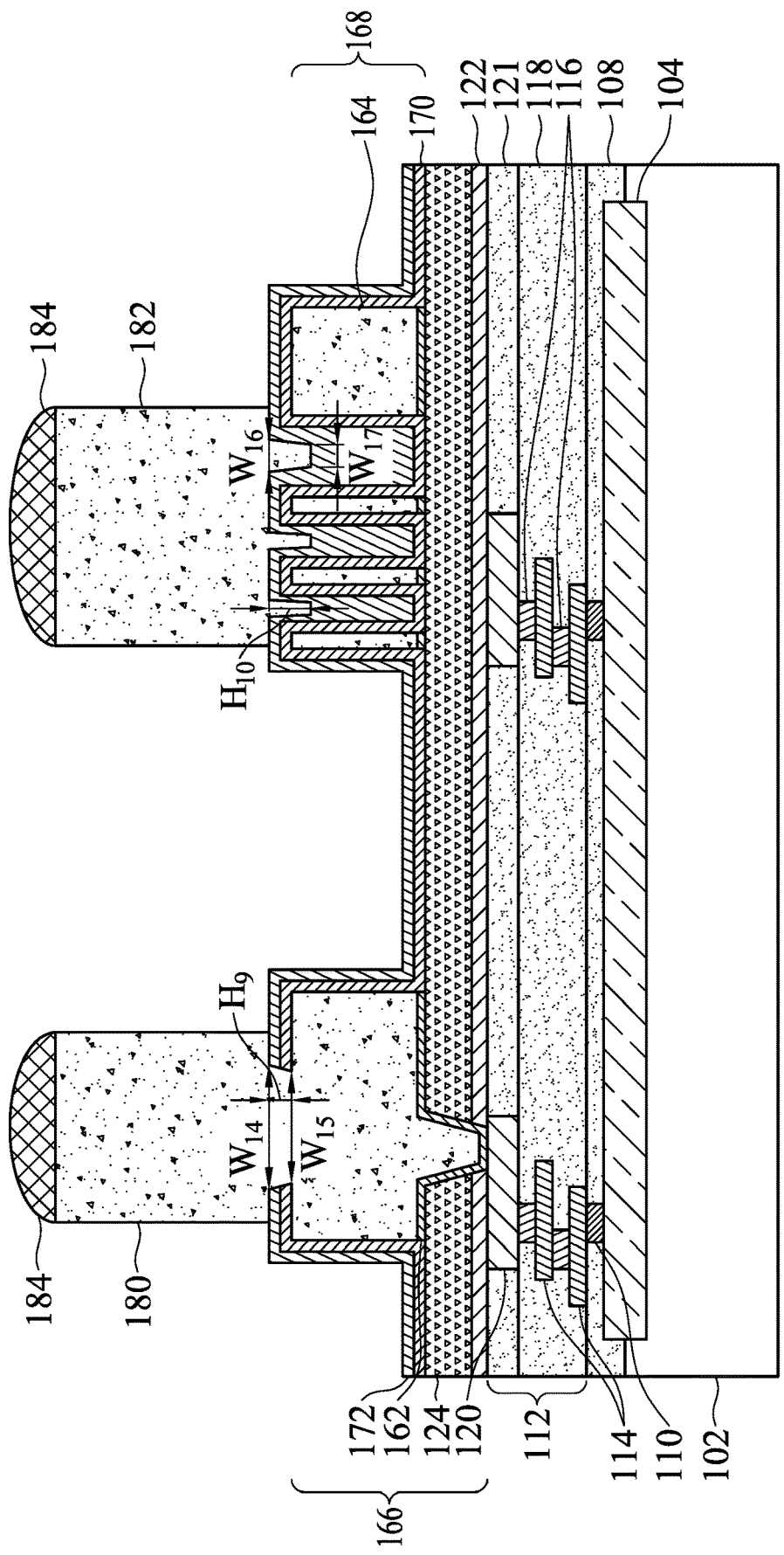

FIG. 18 illustrates an embodiment in which the protection layer 174 is omitted. In the embodiment illustrated in FIG. 18, the UBM structure 180 includes a via portion extending through the fourth passivation layer 172 and the third passivation layer 170 to physically contact and be electrically coupled with the RDL 166. The via portion of the UBM structure 180 may have a width $W_{14}$ ranging from about 5 μm to about 50 μm at a point level with a top surface of the fourth passivation layer 172, a bottom surface of the via portion of the UBM structure 180 may have a width $W_{15}$ ranging from about 5 μm to about 50 μm, and the via portion of the UBM structure 180 may have a height $H_9$ ranging from about 1 μm to about 20 lam measured between the point level with the top surface of the fourth passivation layer 172 and the bottom surface of the via portion of the UBM structure 180. The UBM structure 182 includes via portions extending into the fourth passivation layer 172 without extending through the third passivation layer 170. The UBM structure 182 is electrically isolated from the conductive traces 168 by the third passivation layer 170. The via portions of the UBM structure 182 may have widths $W_{16}$ ranging from about 1.3 lam to about 10 lam level with top surfaces of the fourth passivation layer 172, bottom surfaces of the via portions of the UBM structure 182 may have widths $W_{17}$ ranging from about 0.8 µm to about 9. o lam, and the via portions of the UBM structure 182 may have heights $H_{10}$ ranging from about 0.1 lam to about 3.0 µm measured between the point level with the top surface of the fourth passivation layer 172 and the bottom surfaces of the via portions of the UBM structure 182. The UBM structures 180 and 182 include pad portions extending over and along top surfaces of the fourth passivation layer 172. Omitting the protection layer 174 may reduce aspect ratios (e.g., ratios of the heights to the widths) of openings in which the via portions of the UBM structures 180 and 182 are formed, which allows for the UBM structures 180 and 182 to be more easily formed and prevents voids or other inconsistencies from being formed in the UBM structures 180 and 182. This reduces device defects and improves device performance.

Embodiments may achieve various advantages. For example, forming dummy UBM structures that include via portions extending through an underlying polymer layer and/or passivation layer improves the adhesion of the dummy UBM structures to the underlying layers and increases shear strength of the dummy UBM structures. This reduces device defects and improves device performance. Forming dummy UBM structures with multiple via portions further improves the adhesion of the dummy UBM structures to the underlying layers and increases the shear strength of the dummy UBM structures. Forming the dummy UBM structures with a passivation layer between the dummy UBM structures and RDLs or conductive traces allows the dummy UBM structures to be electrically isolated from the RDLs or conductive traces and provides greater area for routing the RDLs or conductive traces under the dummy UBM structures. This reduces device area and simplifies device layout.

In accordance with an embodiment, a semiconductor device includes a first redistribution line and a second redistribution line over a semiconductor substrate; a first passivation layer over the first redistribution line and the second redistribution line; a second passivation layer over the first passivation layer; a first under-bump metallurgy (UBM) structure over the first redistribution line, the first UBM structure extending through the first passivation layer and the second passivation layer and being electrically coupled to the first redistribution line; and a second UBM structure over the second redistribution line, the second UBM structure extending through the second passivation layer, the second UBM structure being electrically isolated from the second redistribution line by the first passivation layer. In an embodiment, the semiconductor device further includes a protection layer over the second passivation layer, the first UBM structure and the second UBM structure extending through the protection layer. In an embodiment, the protection layer includes a polymer material. In an embodiment, the first passivation layer is a conformal layer, the second passivation layer is a conformal layer, and the protection layer has a planar top surface. In an embodiment, the first passivation layer includes an oxide, and the second passivation layer includes a nitride. In an embodiment, a first width of the first UBM structure at a point level with a top surface of the second passivation layer and a second width of the second UBM structure at a point level with the top surface of the second passivation layer are less than 50 µm. In an embodiment, the first UBM structure includes a first via portion extending through the first passivation layer and the second passivation layer, the first via portion having a first height between a bottom surface of the first UBM structure and a point level with a top surface of the second passivation layer, the second UBM structure includes a second via portion extending through the second passivation layer, the second via portion having a second height between a bottom surface of the second UBM structure and a point level with the top surface of the second passivation layer, and the first height is greater than the second height by 1.0 µm to 2.5 µm.

In accordance with another embodiment, a semiconductor device includes a redistribution line and a plurality of conductive traces over a semiconductor substrate; a passivation structure over the redistribution line and the plurality of conductive traces; a first under-bump metallurgy (UBM) structure over the redistribution line, the first UBM structure extending through the passivation structure and being electrically coupled to the redistribution line; and a second UBM structure over the plurality of conductive traces, the second UBM structure being electrically isolated from the plurality of conductive traces by the passivation structure. In an embodiment, the plurality of conductive traces includes a first conductive trace and a second conductive trace, the second UBM structure includes a second via portion extending between the first conductive trace and the second conductive trace, and a bottom surface of the second via portion is below top surfaces of the first conductive trace and the second conductive trace. In an embodiment, the first conductive trace is separated from the second conductive trace by at least 2.7 µm. In an embodiment, the first UBM structure includes a first via portion extending through the passivation structure to physically contact the redistribution line, the first via portion includes a first height measured between a bottom surface of the first via portion and a point level with a top surface of the passivation structure, the second via portion includes a second height between the bottom surface of the second via portion and a point level with the top surface of the passivation structure, and the second height is greater than the first height. In an embodiment, the semiconductor device further includes a third conductive trace, the second UBM structure further including a third via portion extending between the second conductive trace and the third conductive trace and a pad portion extending over the passivation structure and coupling the second via portion to the third via portion. In an embodiment, the passivation structure includes a first passivation layer over the redistribution line and the plurality of conductive traces and a second passivation layer over the first passivation layer, the first passivation layer including an oxide, and the second passivation layer including a nitride. In an embodiment, the semiconductor device further includes a protection layer over the second passivation layer, the protection layer including a polymer material, the first UBM structure including a first pad portion extending along a top surface of the protection layer, and the second UBM structure including a second pad portion extending along the top surface of the protection layer.

In accordance with yet another embodiment, a method includes forming a first conductive feature and a second conductive feature over a semiconductor substrate; forming a passivation structure over the first conductive feature and the second conductive feature; etching the passivation structure to form a first opening exposing the first conductive feature; etching the passivation structure to form a second opening over the second conductive feature, a first portion of the passivation structure remaining between the second opening and the second conductive feature; forming a first under-bump metallurgy (UBM) structure in the first opening and electrically coupled to the first conductive feature; and forming a second UBM structure in the second opening, the second UBM structure being electrically isolated from the second conductive feature by the first portion of the passivation structure. In an embodiment, forming the passivation structure includes depositing a first passivation layer over the first conductive feature and the second conductive feature; and depositing a second passivation layer over the first passivation layer, the first opening extending through the second passivation layer and the first passivation layer, and the second opening extending through the second passivation layer. In an embodiment, forming the first UBM structure includes forming a first via portion in the first opening and forming a first pad portion extending along a top surface of the second passivation layer, and forming the second UBM structure includes forming a second via portion in the second opening and forming a second pad portion extending along the top surface of the second passivation layer. In an embodiment, the method further includes depositing a protection layer over the passivation structure, the protection layer including a polymer material; and planarizing the protection layer. In an embodiment, etching the passivation structure to form the first opening further includes etching the protection layer, and etching the passivation structure to form the second opening further includes etching the protection layer. In an embodiment, the method further includes forming a third conductive feature over the semiconductor substrate, the second opening being formed extending between the second conductive feature and the third conductive feature in a direction parallel to a major surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first conductive feature and a second conductive feature over a semiconductor substrate, wherein a lower surface of the first conductive feature is level with a lower surface of the second conductive feature;
   forming a passivation structure over the first conductive feature and the second conductive feature;
   after forming the passivation structure, etching the passivation structure to form a first opening exposing the first conductive feature;
   after forming the passivation structure, etching the passivation structure to form a second opening over the second conductive feature, wherein a first portion of the passivation structure remains between the second opening and the second conductive feature;
   forming a first under-bump metallurgy (UBM) structure in the first opening and electrically coupled to the first conductive feature; and
   forming a second UBM structure in the second opening, wherein the second UBM structure is electrically isolated from the second conductive feature by the first portion of the passivation structure.

2. The method of claim 1, wherein forming the passivation structure comprises:
   depositing a first passivation layer over the first conductive feature and the second conductive feature; and
   depositing a second passivation layer over the first passivation layer, wherein the first opening extends through the second passivation layer and the first passivation layer, and wherein the second opening extends through the second passivation layer.

3. The method of claim 2, wherein forming the first UBM structure comprises forming a first via portion in the first opening and forming a first pad portion extending along a top surface of the second passivation layer, and wherein forming the second UBM structure comprises forming a second via portion in the second opening and forming a second pad portion extending along the top surface of the second passivation layer.

4. The method of claim 1, further comprising:
   depositing a protection layer over the passivation structure, the protection layer comprising a polymer material; and
   planarizing the protection layer.

5. The method of claim 4, wherein etching the passivation structure to form the first opening further comprises etching the protection layer, and wherein etching the passivation structure to form the second opening further comprises etching the protection layer.

6. The method of claim 1, further comprising forming a third conductive feature over the semiconductor substrate, wherein the second opening is formed extending between the second conductive feature and the third conductive feature in a direction parallel to a major surface of the semiconductor substrate.

7. The method of claim 1, wherein forming the passivation structure comprises:
   depositing a first passivation layer over the first conductive feature and the second conductive feature; and
   depositing a second passivation layer over the first passivation layer, wherein the second opening extends only partially through the second passivation layer.

8. The method of claim 1, wherein the second conductive feature comprises a plurality of conductive features, wherein the second UBM extends over the plurality of conductive features.

9. A method of forming a semiconductor device, the method comprising:
   forming a first conductive line and a second conductive line over a semiconductor substrate;
   forming a first passivation layer over the first conductive line and the second conductive line, wherein the first passivation layer extends along sidewalls of the first conductive line and the second conductive line;
   forming a second passivation layer over the first passivation layer;
   after forming the first passivation layer and the second passivation layer, forming a first under-bump metallurgy (UBM) structure over the first conductive line, the first UBM structure extending through the first passivation layer and the second passivation layer and being electrically coupled to the first conductive line; and
   after forming the first passivation layer and the second passivation layer, forming a second UBM structure over the second conductive line, the second UBM structure extending at least partially through the second passivation layer, the second UBM structure being electrically isolated from the second conductive line by at least a portion of the first passivation layer.

10. The method of claim 9, wherein the second UBM extends through the second passivation layer.

11. The method of claim 9, wherein the second UBM structure extends on opposing sides of the second conductive line.

12. The method of claim 9, wherein the second conductive line is one of a plurality of conductive lines, wherein the second UBM extends over the plurality of conductive lines.

13. The method of claim 9, wherein the second UBM structure is electrically isolated from the second conductive line by at least a portion of the second passivation layer.

14. The method of claim 9, wherein the second UBM extends below an upper surface of the second passivation layer to a depth in a range between 0.1 µm and 3.0 µm.

15. A method of forming a semiconductor device, the method comprising:
forming a first conductive line and a second conductive line over a semiconductor substrate;
forming a first passivation layer over and along sidewalls of the first conductive line and the second conductive line;
forming a second passivation layer over the first passivation layer;
forming a protection layer over the second passivation layer;
after forming the first passivation layer, the second passivation layer, and the protection layer, forming a first under-bump metallurgy (UBM) structure over the first conductive line, the first UBM structure extending through the protection layer, the first passivation layer, and the second passivation layer and being electrically coupled to the first conductive line; and
after forming the first passivation layer, the second passivation layer, and the protection layer, forming a second UBM structure over the second conductive line, the second UBM structure extending through the protection layer, the second UBM structure being electrically isolated from the second conductive line by at least a portion of the first passivation layer.

16. The method of claim 15, wherein second UBM structure being electrically isolated from the second conductive line by at least a portion of the second passivation layer.

17. The method of claim 15, wherein a region below the second UBM is free of a via coupled to the second conductive line in a cross-sectional view.

18. The method of claim 15, wherein a region below the second UBM comprises a via coupled to the second conductive line.

19. The method of claim 15, wherein the second UBM structure comprises a first protrusion protruding below an upper surface of the second passivation layer, wherein a width of the first protrusion at a point level with the upper surface of the second passivation layer is in a range between 1.3 µm and 10 µm.

20. The method of claim 19, wherein a width of the first protrusion at a bottom of the first protrusion is in a range between 0.8 µm and 9.0 µm.

* * * * *